(12) United States Patent
Fukutani et al.

(10) Patent No.: US 7,879,734 B2
(45) Date of Patent: *Feb. 1, 2011

(54) METHOD OF MANUFACTURING POROUS BODY

(75) Inventors: Kazuhiko Fukutani, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 805 days.

This patent is subject to a terminal disclaimer.

(21) Appl. No.: 11/409,021

(22) Filed: Apr. 24, 2006

(65) Prior Publication Data

US 2006/0192309 A1    Aug. 31, 2006

Related U.S. Application Data

(60) Division of application No. 10/640,047, filed on Aug. 14, 2003, now Pat. No. 7,074,480, which is a continuation of application No. PCT/JP03/03000, filed on Mar. 13, 2003.

(30) Foreign Application Priority Data

| Mar. 15, 2002 | (JP) | ............................. 2002-073112 |
| Mar. 15, 2002 | (JP) | ............................. 2002-073113 |
| Dec. 13, 2002 | (JP) | ............................. 2002-363165 |

(51) Int. Cl.
*H01L 21/302* (2006.01)
*H01L 21/461* (2006.01)

(52) U.S. Cl. .................... 438/745; 438/752; 438/753

(58) Field of Classification Search .................. None
See application file for complete search history.

(56) References Cited

U.S. PATENT DOCUMENTS

| 3,850,762 | A | * | 11/1974 | Smith ........................... 205/75 |
| 5,068,152 | A |   | 11/1991 | Maro et al. |
| 5,244,828 | A |   | 9/1993  | Okada et al. .................. 437/81 |
| 5,858,457 | A |   | 1/1999  | Brinker et al. ............... 427/162 |
| 6,027,796 | A | * | 2/2000  | Kondoh et al. ........... 428/312.8 |
| 6,214,738 | B1|   | 4/2001  | Aiba et al. .................. 438/707 |
| 6,231,744 | B1|   | 5/2001  | Ying et al. |

(Continued)

FOREIGN PATENT DOCUMENTS

JP    46-043414 B    12/1971

(Continued)

OTHER PUBLICATIONS

M. Jacobs et al., "Unbalanced Magnetron Sputtered Si-Al Coatings: Plasma Conditions and Film Properties Versus Sample Bias Voltage," 116-119 *Surface and Coatings Technology* 735-41 (1999).

(Continued)

*Primary Examiner*—Duy-Vu N Deo
(74) *Attorney, Agent, or Firm*—Fitzpatrick, Cella, Harper & Scinto

(57) ABSTRACT

A nanostructure is a porous body comprising a plurality of pillar-shaped pores and a region surrounding them, the region being an oxide amorphous region formed so as to contain C, Si, Ge or a material of a combination of them. Such a nanostructure can be used as a functional material in light emitting devices, optical devices and microdevices. It can also be used as a filter.

10 Claims, 9 Drawing Sheets

U.S. PATENT DOCUMENTS

| | | | | |
|---|---|---|---|---|
| 6,265,321 | B1 | 7/2001 | Chooi et al. | 438/725 |
| 6,359,288 | B1 * | 3/2002 | Ying et al. | 257/14 |
| 6,464,853 | B1 | 10/2002 | Iwasaki et al. | 205/118 |
| 6,476,409 | B2 * | 11/2002 | Iwasaki et al. | 257/13 |
| 6,525,461 | B1 | 2/2003 | Iwasaki et al. | 313/495 |
| 6,541,386 | B2 | 4/2003 | Aiba et al. | 438/707 |
| 6,602,620 | B1 | 8/2003 | Kikitsu et al. | 428/694 T |
| 6,610,463 | B1 | 8/2003 | Ohkura et al. | 430/322 |
| 6,730,421 | B1 | 5/2004 | Kirino et al. | |
| 7,074,480 | B2 * | 7/2006 | Fukutani et al. | 428/312.2 |
| 7,183,127 | B2 * | 2/2007 | Kuriyama et al. | 438/34 |
| 7,192,510 | B2 * | 3/2007 | Den et al. | 205/171 |
| 7,517,554 | B2 | 4/2009 | Saito et al. | |
| 2001/0036563 | A1 | 11/2001 | Watanabe et al. | 428/694 T |
| 2002/0014621 | A1 | 2/2002 | Den et al. | 257/3 |
| 2002/0031008 | A1 | 3/2002 | Den et al. | 365/173 |
| 2002/0086185 | A1 | 7/2002 | Yasui et al. | 428/694 TS |
| 2003/0001150 | A1 | 1/2003 | Iwasaki et al. | 257/3 |
| 2003/0147801 | A1 | 8/2003 | Someya et al. | |
| 2004/0001964 | A1 | 1/2004 | Ohkura et al. | 428/596 |
| 2004/0043208 | A1 | 3/2004 | Fukutani et al. | 428/304.4 |
| 2004/0048092 | A1 | 3/2004 | Yasui et al. | 428/642 |
| 2005/0053773 | A1 | 3/2005 | Fukutani et al. | 428/209 |
| 2006/0032526 | A1 | 2/2006 | Fukutani et al. | |
| 2010/0003822 | A1 | 1/2010 | Miyata et al. | |

FOREIGN PATENT DOCUMENTS

| | | |
|---|---|---|
| JP | 52-78403 | 7/1977 |
| JP | 62-270473 | 11/1987 |
| JP | 63-220411 | 9/1988 |
| JP | 2-139714 A | 5/1990 |
| JP | 5-55545 | 3/1993 |
| JP | 7-73429 | 3/1995 |
| JP | 9-157062 | 6/1997 |
| JP | 9-157062 A | 6/1997 |
| JP | 2000-327491 A | 11/2000 |
| JP | 2001-101644 | 4/2001 |
| JP | 2001-138300 A | 5/2001 |
| JP | 2001-261376 | 9/2001 |
| JP | 2001-273622 | 10/2001 |
| WO | 01/071394 A1 | 9/2001 |
| WO | 01/71394 A1 | 9/2001 |
| WO | WO 03/069677 A1 | 8/2003 |
| WO | WO 03/078685 A1 | 9/2003 |

OTHER PUBLICATIONS

C.D. Adams et al., "Phase Separation During Co-Deposition of Al-Ge Thin Films," 7(3) *J. Mater. Res.* 653-67 (Mar. 1992).

C.D. Adams et al., "Transition from Lateral to Transverse Phase Separation During Film Co-deposition," 59(20) *Appl. Phys. Lett.* 2535-37 (Nov. 1991).

M. Atzmon et al., "Phase Separation During Film Growth," 72(2) *J. Appl. Phys.* 442-46 (Jul. 1992).

C.D. Adams, et al. "Monte Carlo Simulation of Phase Separation During Thin-Film Codeposition," 74(3) *J. Appl. Phys.* 1707-15 (Aug. 1993).

N.E. Sluchanko et al., Physical Review B, The American Physical Society, 1996, vol. 53 (17), 11304-11306.

* cited by examiner

FIG. 4

STEP (a)
FIRST AND SECOND MATERIALS ARE BROUGHT IN.

STEP (b)
STRUCTURAL BODY IS FORMED FROM THE FIRST AND SECOND MATERIALS ON A SUBSTRATE BY USING A FILM FORMING PROCESS FOR FORMING A SUBSTANCE IN A NON-EQUILIBRIUM STATE.

STEP (c)
PILLAR-SHAPED MEMBERS ARE REMOVED FROM THE STRUCTURAL BODY TO PRODUCE A POROUS BODY.

STEP (e')
PORE DIAMETERS OF THE POROUS BODY ARE ENLARGED.

STEP (d)
POROUS BODY IS OXIDIZED.

*FIG. 5A* | STEP OF BRINGING FIRST AND SECOND MATERIALS IN.

FIG. 6A | STEP OF BRINGING FIRST AND SECOND MATERIALS IN.

METHOD OF MANUFACTURING POROUS BODY

This application is a division of application Ser. No. 10/640,047, filed Aug. 14, 2003, which is a continuation of International Application No. PCT/JP03/03000, filed Mar. 13, 2003, which claims the benefit of Japanese Patent Application Nos. 2002-073112, filed Mar. 15, 2002, 2002-073113, filed Mar. 15, 2002, and 2002-363165, filed Dec. 13, 2002. All prior applications are incorporated herein by reference.

BACKGROUND OF THE INVENTION

1. Field of the Invention

This invention relates to a porous body and a method of manufacturing the same.

2. Related Background Art

In recent years, microstructures to be used as functional materials have been objects of growing interest.

Known techniques for preparing such a microstructure include those relying on the semiconductor processing technology, particularly the micro-pattern forming technology such as photolithography, so as to directly prepare a microstructure (see, inter alia, Japanese Patent Application Laid-Open No. 5-55545 (p. 3, FIG. 1)).

Apart from the use of the semiconductor processing technology, there are also known techniques that utilize the phenomenon of self-organization or self-formation. These techniques have been developed to produce novel microstructures on the basis of orderly formed structures that are found in the nature.

While many researches are under way, using techniques that utilize the phenomenon of self-organization or self-formation, because such techniques seem to be promising for realizing microstructures of the order of nanometers, to say nothing of micrometers, they are still not sufficiently proven. Therefore, there is a strong demand for novel microstructures and proven methods for manufacturing such novel microstructures.

SUMMARY OF THE INVENTION

Therefore, it is an object of the present invention to provide a novel porous body and a method of manufacturing the same.

According to the present invention, the above object is achieved by providing a porous body comprising a plurality of pillar-shaped pores and a region surrounding them, the region being an oxide amorphous region formed so as to contain Si, Ge or a material of a combination of them.

Preferably, the pillar-shaped pores are substantially not branched. Preferably, the average intercentral distance of the plurality of pillar-shaped pores is not greater than 30 nm. Preferably, the diameters of the pillar-shaped pores are not greater than 20 nm. According to the invention, preferably, the diameters of the pillar-shaped pores are substantially the same in the direction of depth. The oxide amorphous region may contain aluminum. When the porous body is formed on a substrate, preferably, the direction of depth of the pillar-shaped pores is substantially perpendicular relative to the substrate.

In another aspect of the present invention, there is provided an oxide porous body obtained from a structural body formed so as to contain a first material and a second material by removing the first material from the structural body, the structural body having a structure including pillar-shaped members formed so as to contain the first material and an amorphous region formed so as to contain the second material, the pillar-shaped members being surrounded by the amorphous region, the structural body containing the second material at a ratio of not smaller than 20 atomic % and not greater than 70 atomic % relative to the total quantity of the first and second materials.

Preferably, the first material is aluminum.

Preferably, the second material is Si, Ge, SiGe or a material of a combination of them.

Preferably, the average intercentral distance of the plurality of pillar-shaped pores is not greater than 30 nm and the diameters of the pillar-shaped pores are not greater than 20 nm.

In still another aspect of the present invention, there is provided a method of manufacturing a porous body comprising a step of preparing a structural body formed so as to contain a first material and a second material and including pillar-shaped members formed so as to contain the first material and surrounded by a region formed so as to contain the second material, a removal step of removing the pillar-shaped members from the structural body and a step of oxidizing the region.

Preferably, the structural body contains the second material at a ratio of not smaller than 20 atomic % and not greater than 70 atomic % relative to the total quantity of the first and second materials.

Preferably, the first material is aluminum. Preferably, the second material is Si, Ge, SiGe or a material of a combination of them.

Preferably, the structural body is prepared by using a film-forming process of forming film in a non-equilibrium state. The removal step may be a wet etching using acid or alkali.

After the removal step, the pore diameters of narrow pores formed in the removal step may be enlarged. The process of enlarging the pore diameters may be conducted before oxidizing the region or after oxidizing the region. It may alternatively be conducted at the time of oxidizing the region.

Preferably, the diameters of the pillar-shaped members are not greater than 20 nm and the average intercentral distance of the plurality of pillar-shaped members is not greater than 30 nm.

The region may be processed for oxidization after forming the porous body by the removal step or simultaneously with the process of forming narrow pores in the structural body by the removal step.

In still another aspect of the invention, there is provided a method of manufacturing a porous body comprising a step of preparing a structural body formed so as to contain aluminum and silicon and including pillar-shaped members formed so as to contain aluminum and a silicon region surrounding the pillar-shaped members, the structural body containing silicon at a ratio of not smaller than 20 atomic % and not greater than 70 atomic % relative to the total quantity of aluminum and silicon, a step of forming a porous body by removing the pillar-shaped members from the structural body and a step of oxidizing the porous body.

The silicon region may contain germanium.

In still another aspect of the invention, there is provided a method of manufacturing a porous body comprising a step of preparing a structural body including aluminum-containing pillar-shaped structures and a silicon region surrounding the pillar-shaped structures, the structural body containing silicon at a ratio of not smaller than 20 atomic % and not greater than 70 atomic % relative to the total quantity of aluminum and silicon and a step of processing the structural body by anodic oxidization.

A porous body according to the invention can find applications in filters and mask materials.

In still another aspect of the invention, there is provided an oxide porous body having pillar-shaped narrow pores and a region surrounding them, the average diameters of the narrow pores being not greater than 20 nm and the average intercentral distance of the narrow pores is not greater than 30 nm. The region contains oxide of a second material that may or may not contain oxide of a first material.

In a still another aspect of the invention, there is provided a method of manufacturing an oxide porous body comprising a step of preparing a structural body formed so as to contain a first material and a second material and including pillar-shaped members formed so as to contain the first material and surrounded by a region formed so as to contain the second material, the structural body containing the second material at a ratio of not smaller than 20 atomic % and not greater than 70 atomic % relative to the total quantity of the first and second materials, a removal step of removing the pillar-shaped members from the structural body and a step of oxidizing the structural body to be conducted after or simultaneously with the removal step.

Preferably, the first material is aluminum and the second material is silicon, germanium or silicon and germanium.

In a further aspect of the present invention, there is provided a porous body comprising pillar-shaped holes and a region surrounding them, the region being an insulating region. The entire porous body may be oxidized or, alternatively, the narrow pore walls and their vicinities may be selectively oxidized. Unoxidized regions may be made to remain in the inside of the narrow pore walls.

The region (namely porous body) may contain aluminum by not smaller than 1% and not greater than 20%. The unit is atomic %.

If the first material is aluminum and the second material is silicon, the above ratios refer to those of aluminum contained in the Si porous body. The oxygen contained in the porous body is excluded from the above ratios.

It is possible to provide a filter or a mask material to be used for etching processes by utilizing a porous body according to the invention.

BRIEF DESCRIPTION OF THE DRAWINGS

FIG. 4 is a schematic illustration of still another mode of carrying out a method of manufacturing an oxide porous body according to the invention, showing different steps thereof;

FIGS. 5A, 5B, 5C, 5D and 5E are schematic illustrations of still another mode of carrying out a method of manufacturing an oxide porous body according to the invention, showing different steps thereof;

FIGS. 6A, 6B, 6C, 6E and 6D are schematic illustrations of still another mode of carrying out a method of manufacturing an oxide porous body according to the invention, showing different steps thereof;

DETAILED DESCRIPTION OF THE PREFERRED EMBODIMENTS

Figure 1A:
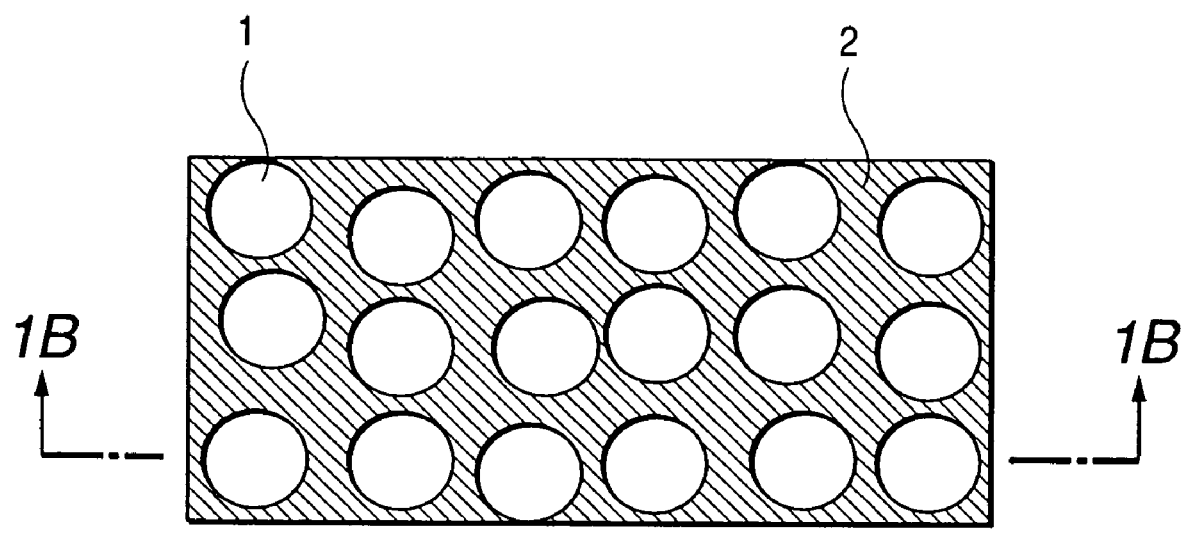
FIGS. 1A and 1B are schematic illustrations of an oxide porous body according to the invention.

Now, the present invention will be described in greater detail by referring to the accompanying drawings.

Firstly, a structural body that is applicable to the present invention will be described.

(1) Structural Body Applicable to the Present Invention

A structural body that is applicable to the present invention is characterized in that it is formed so as to contain a first material and a second material and includes pillar-shaped members formed so as to contain the first material and surrounded by an amorphous region formed so as to contain the second material and that it contains the second material at a ratio of not smaller than 20 atomic % and not greater than 70 atomic % relative to the total quantity of the first and second materials. A porous body according to the invention is obtained by a method comprising a removal step of removing the pillar-shaped members from the structural body and an oxidation step. As for these two processing steps, the oxidation steps may be conducted simultaneously with the removal step or after the removal step. Alternatively, the removal step may be conducted after the oxidation step. The expression of simultaneously as used herein does not mean that the two steps need to be conducted rigorously at the same time. In other words, there may be acceptable instances where the body is oxidized as a result of the removal step involving an etching operation.

The above ratio is the content ratio of the second material relative the total amount of the first and second materials that the structural body comprises. Preferably, it is not smaller than 25 atomic % and not greater than 65 atomic %. More preferably, it is not smaller than 30 atomic % and not greater than 60 atomic %.

For the purpose of the invention, it is sufficient that pillar-shaped profiles are substantially realized in the structural body. For example, the pillar-shaped members may contain the second material as ingredient, while the surrounding region may contain the first material. Additionally, the pillar-shaped members and the surrounding region may contain oxygen and/or argon.

The ratio can be determined by quantitative analysis using inductively coupled plasma atomic emission spectroscopy (ICP-AES). While atomic % is used as unit for the purpose of the present invention, the expression of not smaller than 20 atomic % and not greater than 70 atomic % may be paraphrased as not smaller than 20.65 wt % and not greater than 70.84 wt % if wt % is used as unit (an atomic weight of 26.982 is used for Al of the first material and an atomic weight of 28.086 is used for Si of the second material for the above paraphrase).

Substances that can be used for the first material include Al, Au, Ag and Mg. On the other hand, substances that can be used for the second material include Si, Ge and $Si_xGe_{1-x}$. Particularly, it is desirable that a material that can take an amorphous form is used for the second material. A combination of such materials that have a eutectic point in the phase equilibrium graph of the two ingredient systems of the two materials are preferably used for the first and second materials (materials of a so-called eutectic system). Particularly, for the purpose of the invention, the eutectic point is preferably not less than 300° C., more preferably not less than 400° C. A eutectoid system may also be used for the first and second materials. Preferable combinations of the first and second materials include the use of Al for the first material and the use of Si for the second material, the use of Al for the first material and the use of Ge for the second material and the use of Al for the first material and the use of $Si_xGe_{1-x}$ (0<x<1) for the second material. The ratio of the first material (e.g., aluminum) contained in the region that the surrounding body comprises is preferably not smaller than 1 atomic % and not greater than 20 atomic %. The above ratio does not take the oxygen contained in the surrounding body into consideration.

It is desirable that the region surrounding the pillar-shaped members is amorphous.

The pillar-shaped members show a cylindrical or elliptic plan view.

Thus, the plurality of pillar-shaped members are distributed in the matrix formed so as to contain the second material. While the diameters of the pillar-shaped members (assuming that the pillar-shaped members show a cylindrical plan view) can be controlled by controlling the chemical composition of the structural body (namely, the content ratio of the second material), the average diameter is not smaller than 0.5 nm and not greater than 50 nm, preferably not smaller than 0.5 nm and not greater than 20 nm, more preferably not smaller than 0.5 nm and not greater than 10 nm. The term of diameter as used herein refers to $2r$ in FIG. 1B. If the plan view is elliptic, it is sufficient that the length of the major axis is found within the above defined range. The average diameter can be obtained by observing a picture showing the pillar-shaped members actually taken by means of SEM photography (in an area of about 100 nm×100 nm) directly or by processing the image of the picture by means of a computer. The lower limit of the average diameter is 1 nm or more, preferably several nanometers or more from a practical point of view, although it may depend on the device to which the structural body is applied and the processing operation to which the structural body is subjected.

The average intercentral distance $2R$ (see FIG. 1B) of the plurality of pillar-shaped members is not smaller than 2 nm and not greater than 30 nm, preferably not smaller than 5 nm and not greater than 20 nm, more preferably not smaller than 5 nm and not greater than 15 nm. It may be needless to say that at least the intercentral distance $2R$ needs to be such that any two adjacently located pillar-shaped members do not contact each other.

It is particularly preferable that the average diameter is not greater than 20 nm and the average intercentral distance is not greater than 30 nm.

The structural body is preferably a film-shaped structural body. If such is the case, the pillar-shaped members are distributed in the matrix formed so as to contain the second material in such a way that they are substantially perpendicular relative to the intraplanar direction of the film. While the film thickness of the film-shaped structural body is not subjected to any particular limits, it is normally within a range between 1 nm and 100 μm. A more practical range that takes the processing time into consideration is between 1 nm and 1 μm. Particularly, it is desirable that the pillar-shaped structure is maintained when the film thickness exceeds 300 nm. The pillar-shaped members show a pillar-shaped structure that is substantially not branched in the direction of height.

The structural body is preferably a film-shaped structural body and may be arranged on a substrate. While there are not limitations to the use of a substrate, substrates that can be used for the purpose of the invention include insulating substrates such as quartz glass substrates, semiconductor substrates such as silicon substrates, gallium arsenide substrates, indium phosphide substrates and so on, metal substrates of aluminum, etc., and flexible substrates (e.g., of polyimide resin) provided that a structural body can be formed on the substrate that operates as support member. Pillar-shaped members are formed on a substrate in such a way that they are substantially perpendicular relative to the substrate. A carbon substrate may also be used for the purpose of the invention. When a silicon substrate is used, it may be a P-type, N-type, high resistance or low resistance substrate.

The structural body can be prepared by utilizing a process for forming film in a non-equilibrium state. While a sputtering process is preferably used for forming film for the purpose of the invention, any other appropriate film forming process for forming film in a non-equilibrium state may also be used. Film forming methods for forming film in a non-equilibrium state that can be applied to the present invention include resistance heating evaporation, electron beam evaporation (EB evaporation) and ion plating. Sputtering methods that can be used for the purpose of the invention include magnetron sputtering, RF sputtering, ECR sputtering and DC sputtering. When a sputtering method is used, the film forming operation is conducted in an argon gas atmosphere of a reaction system where the internal pressure is held to about 0.2 to 1 Pa or about 0.1 to 1 Pa. For the sputtering operation, the first material and the second material may be brought in separately as target materials. Alternatively, a target material obtained by baking in advance the first and second materials showing a desired quantity ratio may be used. It is desirable to conduct the sputtering operation in such a way that plasma does not practically contact the substrate on which a structural body grows.

When forming a structural body on a substrate, the substrate temperature is held not lower than 20° C. and not higher than 300° C., preferably not lower than 20° C. and not higher than 200° C., more preferably not lower than 100° C. and not higher than 150° C.

A porous body that comprises a number of pillar-shaped pores is produced when the pillar-shaped members are removed from the structural body (by wet etching or dry etching). It is only necessary to selectively remove the pillar-shaped members by etching. The etching solution to be used for the etching process may suitably be selected from phosphoric acid, sulfuric acid, hydrochloric acid, nitric acid and other acids. It is desirable that the pores of the porous body that are formed by removing the pillar-shaped members are independent from each other without connecting with each other. When oxidizing the porous body, the structural body having narrow pores may be completely oxidized or, alternatively, areas that are not oxidized may be left in the inside of the pore walls.

(2) The First and Second Materials of the Structural Body

Now, the ratio of the first material (for forming pillar-shaped members) and the second material (for forming a region surrounding the pillar-shaped members) of a structural body applicable to the present invention will be discussed below.

The present invention that provides a porous body as disclosed herein is based on the achievement of the inventors of the present invention for preparing a structural body that is realized as a result of research efforts.

Figure 7:
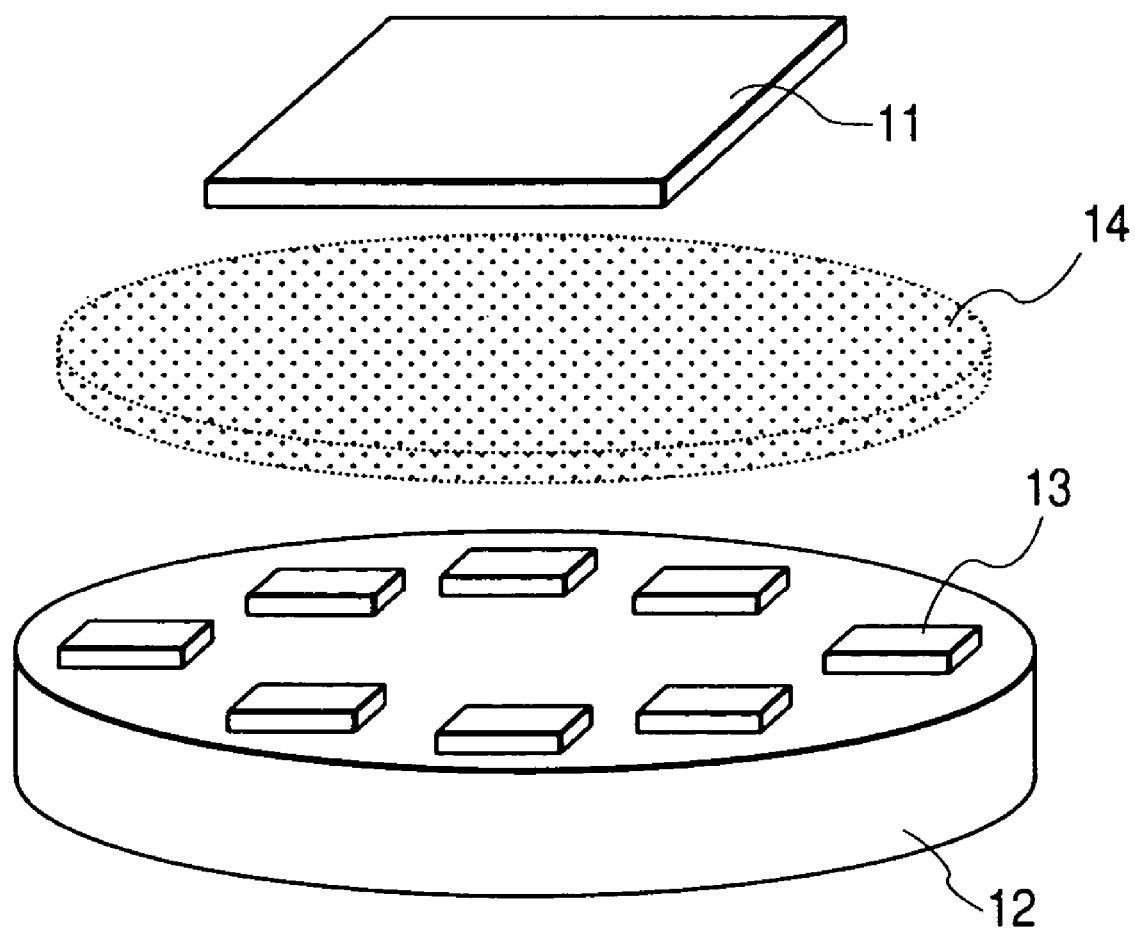
FIG. 7 is a schematic illustration of a film forming method that can be used for a structural body according to the invention.

Referring to FIG. 7, an aluminum/silicon composite film (which is a structural body applicable to the present invention) containing silicon by 55 atomic % relative to the total quantity of aluminum and silicon was formed to a film thickness of about 200 nm on a glass substrate by RF magnetron sputtering (generating plasma 14).

As target, eight 15 mm square silicon chips 13 were put on a 4-inch aluminum target 12 as shown in FIG. 7. The sputtering conditions were as follows. An RF power source was used with Ar flow rate: 50 sccm, discharge pressure: 0.7 Pa and supplied power: 1 kW. The substrate was held at room temperature.

While a target prepared by putting eight silicon chips 13 on an aluminum target 12 was used, the number of silicon chips is not limited to eight. In other words, it is only necessary that the silicon content in the aluminum/silicon composite film is somewhere around 55 atomic % and therefore the number of chips may be changed depending on the sputtering conditions. Furthermore, the target is not limited to one prepared by putting silicon chips on an aluminum target and a target prepared by putting aluminum chips on a silicon target or one prepared by sintering powdery silicon and aluminum may alternatively be used.

Then, the silicon content (atomic %) relative to the total quantity of aluminum and silicon in the obtained aluminum/silicon composite film was analyzed by means of ICP-AES (inductively coupled plasma atomic emission spectroscopy). As a result, it was found that the silicon content was about 55 atomic % relative to the total quantity of aluminum and silicon. For the convenience of measurement, an aluminum/silicon composite film deposited on a carbon substrate was used.

Thereafter, the aluminum/silicon composite film was observed through an FE-SEM (field emission scanning electron microscope). It was found that cylindrical aluminum nanostructures were two-dimensionally arranged and surrounded by silicon. The average pore diameter of the aluminum nanostructures was 3 nm and the average intercentral gap of the pores was 7 nm. When a cross section was observed through an FE-SEM, the aluminum nanostructures were independent from each other and showed a height of 200 nm.

The specimen was observed by X-ray diffractometry but it was not possible to confirm the existence of a peak that indicates the crystallinity of silicon. In other words, the silicon of the specimen was amorphous. On the other hand, a number of peaks indicating the crystallinity of aluminum were observed to prove that at least part of the aluminum was polycrystalline.

Thus, it was possible to prepare an aluminum/silicon nanostructure containing aluminum wires with an average intercentral gap 2R of 7 nm, an average diameter 2r of 3 nm and a height L of 200 nm that were surrounded by silicon.

In this way, the inventors of the present invention found that it is possible to produce an aluminum/silicon nanostructure comprising aluminum quantum dots or aluminum quantum wires with a size of several nanometers in a silicon matrix arranged on the surface of a substrate by forming an aluminum/silicon composite film by means of a film forming process of forming a substance in a non-equilibrium state.

(Example for Comparison)

As specimen A for comparison, an aluminum/silicon composite film containing silicon by 15 atomic % relative to the total quantity of aluminum and silicon was formed to a film thickness of about 200 nm on a glass substrate by sputtering. As target, two 15 mm square silicon chips 13 were put on a 4-inch aluminum target 12. The sputtering conditions were as follows. An RF power source was used with Ar flow rate: 50 sccm, discharge pressure: 0.7 Pa and supplied power: 1 kW. The substrate was held at room temperature.

Thereafter, the specimen A for comparison was observed through an FE-SEM (field emission scanning electron microscope). It was found that, when observed from right above the substrate, the aluminum portions did not show any cylindrical profile but linked to each other. In other words, a microstructure in which pillar-shaped structures of aluminum were homogeneously distributed in a silicon region could not be obtained. Furthermore, they showed a size far greater than 10 nm. When a cross section was observed through an FE-SEM, the aluminum portions showed a width far greater than 15 nm. Then, the silicon content (atomic %) relative to the total quantity of aluminum and silicon in the obtained aluminum/silicon composite film was analyzed by means of ICP-AES (inductively coupled plasma atomic emission spectroscopy). As a result, it was found that the silicon content was about 15 atomic % relative to the total quantity of aluminum and silicon.

Additionally, as specimen B for comparison, an aluminum/silicon composite film containing silicon by 75 atomic % relative to the total quantity of aluminum and silicon was formed to a film thickness of about 200 nm on a glass substrate by sputtering. As target, fourteen 15 mm square silicon chips 13 were put on a 4-inch aluminum target 12. The sputtering conditions were as follows. An RF power source was used with Ar flow rate: 50 sccm, discharge pressure: 0.7 Pa and supplied power: 1 kW. The substrate was held at room temperature.

Thereafter, the specimen B for comparison was observed through an FE-SEM (field emission scanning electron microscope). When observed from right above the substrate, no aluminum area was found on the surface of the specimen. When a cross section was observed through an FE-SEM, no aluminum was found either. Then, the silicon content (atomic %) relative to the total quantity of aluminum and silicon in the obtained aluminum/silicon composite film was analyzed by means of ICP-AES (inductively coupled plasma atomic emission spectroscopy). As a result, it was found that the silicon content was about 75 atomic % relative to the total quantity of aluminum and silicon.

Other specimens were prepared in conditions same as those used for the specimen A for comparison except that the number of silicon chips was changed so that the silicon content ratios of the obtained specimens of aluminum/silicon composite films were 20 atomic %, 25 atomic %, 35 atomic %, 50 atomic %, 55 atomic %, 60 atomic %, 65 atomic % and 70 atomic % relative to the total quantity of aluminum and silicon. A specimen that showed microstructures in which pillar-shaped aluminum structures were distributed in the silicon region was rated as o, whereas a specimen that did not show any such microstructure was rated as x. The results of evaluation are shown in Table 1 below. From the viewpoint of uniformity of pillar-shaped structures, the silicon content ratio is preferably not smaller than 30 atomic % and not greater than 60 atomic %. The contained aluminum shows only a low level of crystallinity and was almost amorphous when the silicon content ratio is as high as 65 or 70 atomic %.

TABLE 1

| silicon content ratio (atomic %) | microstructures |
|---|---|
| 15 (Specimen A for Comparison) | x |
| 20 | o |
| 25 | o |
| 35 | o |
| 50 | o |
| 55 | o |
| 60 | o |
| 65 | o |

TABLE 1-continued

| silicon content ratio (atomic %) | microstructures |
|---|---|
| 70 | o |
| 75 | x |
| (Specimen B for Comparison) | |

As described above, it is possible to produce a structure in which pillar-shaped structures of aluminum are uniformly distributed in a silicon region by regulating the silicon content so as to be not smaller than 20 atomic % and not greater than 70 atomic % relative the total quantity of aluminum and silicon. The pore diameter of the pillar-shaped structures can be controlled and highly linear aluminum wires can be produced by appropriately selecting the content ratios of aluminum and silicon. The obtained microstructures can also be observed by means of a TEM (transmission electron microscope) instead of an SEM.

As still another specimen for comparison, or specimen C, an aluminum/silicon composite film containing silicon by 55 atomic % relative to the total quantity of aluminum and silicon was formed to a film thickness of about 200 nm on a glass substrate by sputtering. As target, eight 15 mm square silicon chips 13 were put on a 4-inch aluminum target 12. The sputtering conditions were as follows. An RF power source was used with Ar flow rate: 50 sccm, discharge pressure: 0.7 Pa and supplied power: 1 kW. The substrate was held to 350° C.

Thereafter, the specimen C for comparison was observed through an FE-SEM (field emission scanning electron microscope). When observed from right above the substrate, large aluminum blocks were found. It was also found by X-ray diffractometry that silicon had been crystallized. In other words, no nanostructures of aluminum having a pillar-shaped profile were found and it was found that the silicon region had been crystallized. In other words, the silicon region was not amorphous. Thus, it may be safe to assume that, when the temperature of the silicon substrate is too high, the silicon moves into a more stable state so that it is no longer possible to cause a film to grow so as to produce nanostructures of aluminum.

In a mode of carrying out the invention to obtain a structural body in which pillar-shaped members are uniformly distributed, it is preferable to select a composition Al:Si=55: 45 for the target.

While aluminum and silicon are used respectively as the first and second materials in the above description, similar results were obtained when other combinations of substances selected from those listed above were used.

Now, a porous body formed by utilizing a structure as described above and a method of manufacturing a porous body according to the invention will be discussed below.

(3) A Porous Body According to the Invention

A porous body according to the invention is characterized in that it comprises a plurality of pillar-shaped holes and a region surrounding them and the region is an oxide amorphous region formed so as to contain Si, Ge or a material of a combination of them.

Figure 1B:
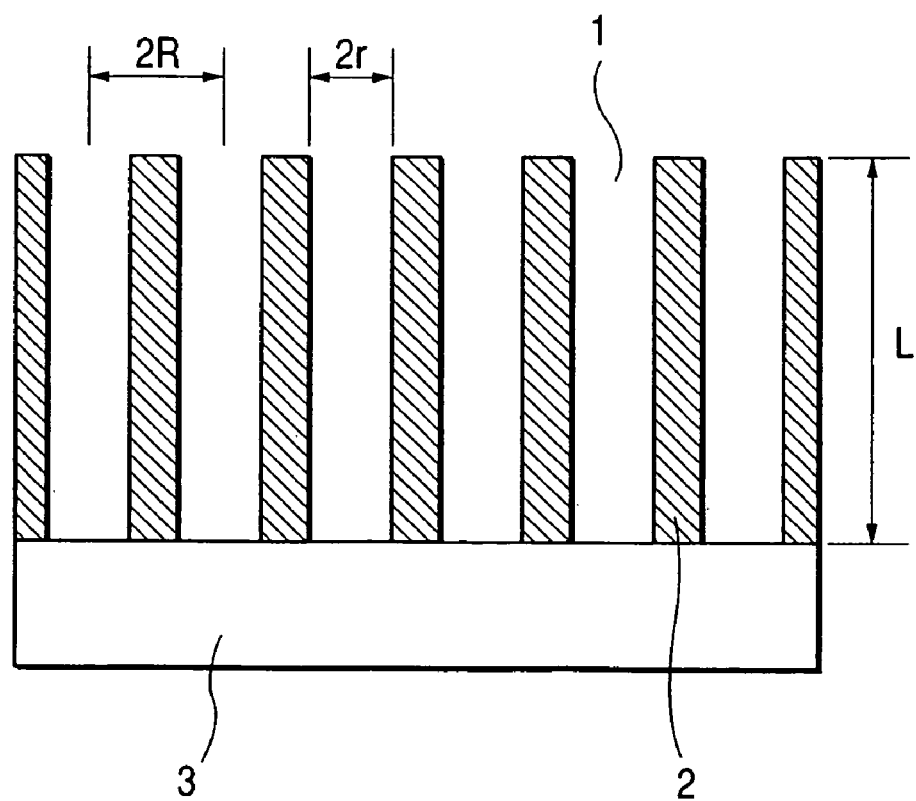

Referring to FIG. 1A, reference symbol 1 denotes a plurality of pillar-shaped holes and reference symbol 2 denotes an oxide region surrounding them (which is typically formed from Si, Ge or a material of a combination of them). In FIG. 1B, reference symbol 3 denotes a substrate.

FIG. 1B is a schematic cross sectional view of the porous body taken along broken line 1B-1B in FIG. 1A.

Thus, according to the invention, there is provided a porous body having pores that are not practically branched as shown in FIG. 1B. As clearly seen from FIG. 1B, the narrow pores are independent from each other and standing perpendicularly or substantially perpendicularly from the film surface (or the substrate). According to the invention, the average intercentral distance of the plurality of pores (2R in FIG. 1B) can be made smaller than 30 nm, while the average diameter of the pillar-shaped pores (2r in FIG. 1B) can be made smaller than 20 nm.

Preferably, the diameters 2r of the narrow pores are between 0.5 and 15 nm and the intercentral distances 2R of the pores are between 5 and 20 nm. The length L of the pores is found in a range between 0.5 nm and several micrometers (μm), preferably between 2 nm and 5 μm. The average pore diameter as used herein refers to the average of the lengths of the major axes obtained by observing a picture showing the pillar-shaped members actually taken by means of SEM photography (in an area of about 100 nm ×100 nm) and processing (extracting) the image of narrow pores in the picture by means of a computer, assuming that the pores show elliptic plan views.

While the narrow pores in a porous body according to the invention can be made to directly face the substrate as shown in FIG. 1B, the present invention is by no means limited thereto and the pores do not need to be made to directly face the substrate.

As for the composition of the region 2 of a porous body according to the invention, while the region 2 contains oxide of the second material as major ingredient, it may additionally contain other elements such as aluminum (Al) and argon (Ar) by several to tens of several atomic %. Aluminum and other elements may be found in the porous body particularly when pillar-shaped members that were formed so as to contain the above described first material such as aluminum existed at positions where pillar-shaped narrow pores exist. The concentration of the first material that formed the pillar-shaped members is high on or near the pore walls of the porous body but low in the inside of the pore walls. In other words, the first material in the porous body shows a concentration distribution in the intraplanar direction. The concentration distribution will be reduced when the first material, which may typically be aluminum, is diffused by heat treatment or some other means.

A porous body according to the invention is amorphous both on and near the pore walls and in the inside of the pore walls.

The second material is Si, Ge, SiGe or a material of a combination of any of them.

The region 2 of a porous body according to the invention is amorphous and, when viewed from right above the substrate, the narrow pores may show a substantially cylindrical plan view as shown in FIG. 1A or they may provide some other views such as an elliptic plan view.

In a cross sectional view of a silicon porous body according to the invention, the narrow pores may show a rectangular profile as shown in FIG. 1B or they may provide some other view such as a square or frusto-conical profile.

Preferably, the plurality of pores keeps a substantially same diameter along their heights. The region 2 may contain aluminum.

According to the invention, the aspect ratio of the narrow pores that is the ratio of the length to the pore diameter (length/pore diameter) can be between 0.1 and 10,000.

A porous body according to the invention is an oxide porous body obtained by removing the first material from the structural body formed so as to contain the first material and the second material. The structural body has a structure in which pillar-shaped members formed so as to contain the first material are surrounded by an amorphous region formed so as to contain the second material and the content of the second material in the structural body is not smaller than 20 atomic % and not greater than 70 atomic % relative to the total quantity of the first and second materials. The first material is aluminum and the second material is typically Si, Ge, SiGe or a material of a combination of any of them.

An oxide porous body according to the invention is characterized in that it is a film-shaped structural body having pillar-shaped narrow pores and an oxide region and the narrow pores are arranged perpendicularly or substantially perpendicularly relative to the film surface while the average diameter of the narrow pores being not greater than 20 nm and the average intercentral distance of the narrow pores is not greater than 30 nm, the narrow pores being separated from each other by the oxide region.

As shown in FIG. 1B, the narrow pores are separated from each other by the silicon oxide region. They are independent from each other. In other words, any of them are linked to each other. They are perpendicular or substantially perpendicular relative to the substrate.

The narrow pores of an oxide porous body according to the invention show a pillar-shaped profile as shown in FIG. 1B. The diameter (average pore diameter) $2r$ of the narrow pores is not greater than 20 nm and the gap (average intercentral distance) $2R$ separating the narrow pores is not greater than 30 nm. Preferably, the diameter $2r$ of the narrow pores is between 1 and 15 nm and the gap $2R$ is between 5 and 20 nm. The length L of the narrow pores is in a range between 5 nm and several micrometers, preferably in a range between 2 nm and 1,000 nm. The average pore diameter as used herein refers to the average of the lengths of the major axes obtained by observing a picture showing the pillar-shaped members actually taken by means of SEM photography (in an area of about 100 nm×100 nm) and processing (extracting) the image of narrow pores in the picture by means of a computer, assuming that the pores show elliptic plan views.

While the narrow pores in an oxide porous body according to the invention can be made to directly face the substrate as shown in FIG. 1B, the present invention is by no means limited thereto and the pores do not need to be made to directly face the substrate.

When an oxide porous body according to the invention is made to contain silicon oxide (SiOx) as principal ingredient, it may additionally contain aluminum oxide (AlOx) as well as other elements such as argon (Ar). The silicon (Si) content of the silicon oxide region is not smaller than 80 atomic %, preferably in a range between 85 and 99 atomic %, relative to the total quantity of all the elements in the region except oxygen.

When aluminum is used as the first material, the aluminum content in the obtained porous body is within a range between 0.01 and 20 atomic %, preferably in a range between 0.1 and 10 atomic %, relative to the total quantity of all the elements of the porous body except oxygen.

With regard to the pillar-shaped profile of the narrow pores, the narrow pores may show any aspect ratio (length L/pore diameter $2r$) so long as they meet the above described dimensional requirements. However, the aspect ratio (length L/pore diameter $2r$) is preferably in a range between 0.5 and 1,000.

Now, the present invention will be described in terms of specific materials. However, it should be noted that the present invention is by no means limited to the specific materials that are cited in the following description.

(3-1) Silicon Oxide Porous Body

A silicon oxide porous body according to the invention is characterized in that it comprises pillar-shaped narrow pores and a silicon oxide region surrounding them and the average pore diameter of the narrow pores is not greater than 20 nm, while the average gap separating the narrow pores is not greater than 30 nm.

Preferably, a silicon oxide porous body according to the invention is a film-shaped silicon oxide porous body that comprises pillar-shaped narrow pores and a silicon oxide region containing silicon oxide as principal ingredient. In the silicon oxide porous body, the narrow pores are standing perpendicularly or substantially perpendicularly relative to the film surface and the average pore diameter of the narrow pores is not greater than 20 nm while the average gap is not greater than 30 nm and the narrow pores are separated from each other by the silicon oxide region containing silicon oxide as principal ingredient.

Preferably, the average pore diameter of the narrow pores is between 1 and 15 nm and the average gap separating the narrow pores from each other is between 5 and 20 nm.

Preferably, the silicon oxide region contains silicon by not less than 80 atomic % relative to the total quantity of all the elements of the region except oxygen.

Preferably, the silicon oxide region contains silicon oxide and aluminum oxide.

Preferably, the silicon oxide is amorphous.

(3-2) Germanium Oxide Porous Body

A germanium oxide porous body according to the invention is characterized in that it comprises pillar-shaped narrow pores and a germanium oxide region surrounding them and the average pore diameter of the narrow pores is not greater than 20 nm, while the average gap separating the narrow pores is not greater than 30 nm.

Preferably, a germanium oxide porous body according to the invention is a film-shaped germanium oxide porous body that comprises pillar-shaped narrow pores and a germanium oxide region containing germanium oxide as principal ingredient. In the germanium oxide porous body, the narrow pores are standing perpendicularly or substantially perpendicularly relative to the film surface and the average pore diameter of the narrow pores is not greater than 20 nm while the average gap is not greater than 30 nm and the narrow pores are separated from each other by the germanium oxide region containing germanium oxide as principal ingredient.

Preferably, the average pore diameter of the narrow pores is between 1 and 15 nm and the average gap separating the narrow pores from each other is between 5 and 20 nm.

Preferably, the germanium oxide region contains germanium by not less than 80 atomic % relative to the total quantity of all the elements of the region except oxygen.

Preferably, the germanium oxide region contains germanium oxide and aluminum oxide.

Preferably, the germanium oxide is amorphous.

(3-3) Silicon Germanium Oxide Porous Body

A silicon germanium oxide porous body according to the invention is characterized in that it comprises pillar-shaped narrow pores and a silicon germanium oxide region surrounding them and the average pore diameter of the narrow pores is not greater than 20 nm, while the average gap separating the narrow pores is not greater than 30 nm.

Preferably, a silicon germanium oxide porous body according to the invention is a film-shaped silicon germanium oxide porous body that comprises pillar-shaped narrow pores and a silicon germanium oxide region containing silicon germanium oxide as principal ingredient. In the silicon germanium oxide porous body, the narrow pores are standing perpendicularly or substantially perpendicularly relative to the film surface and the average pore diameter of the narrow pores is not greater than 20 nm while the average gap is not greater than 30 nm and the narrow pores are separated from each other by the silicon germanium oxide region containing silicon germanium oxide as principal ingredient.

Preferably, the average pore diameter of the narrow pores is between 1 and 15 nm and the average gap separating the narrow pores from each other is between 5 and 20 nm.

Preferably, the silicon germanium oxide region contains silicon and germanium, as put together, by not less than 80 atomic % relative to the total quantity of all the elements of the region except oxygen.

When the compositional ratio of silicon (Si) and germanium (Ge) in the silicon germanium oxide region is expressed by formula $Si_xGe_{1-x}$, preferably x is found within a range of $0<x<1$.

Preferably, the silicon germanium oxide is amorphous.

(4) Method of Manufacturing an Oxide Porous Body According to the Invention

Figure 2A:
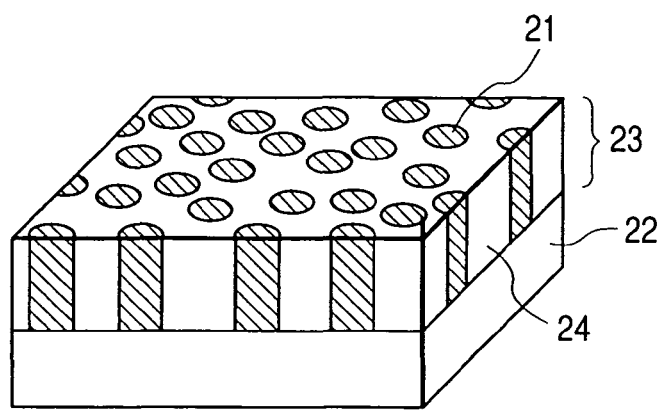
FIGS. 2A, 2B, 2C and 2D are schematic illustrations of a mode of carrying out a method of manufacturing an oxide porous body according to the invention, showing different steps thereof.
Figure 2B:
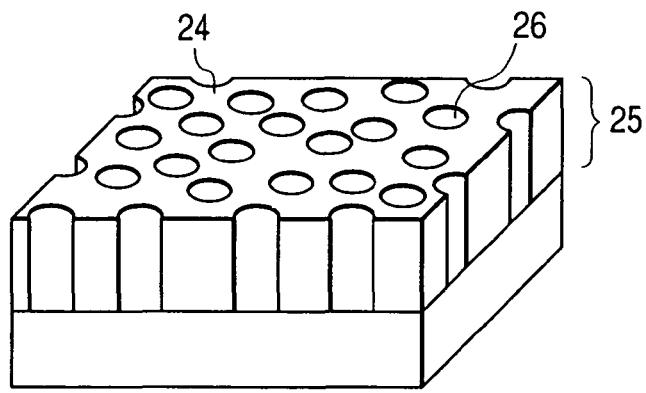
Figure 2C:
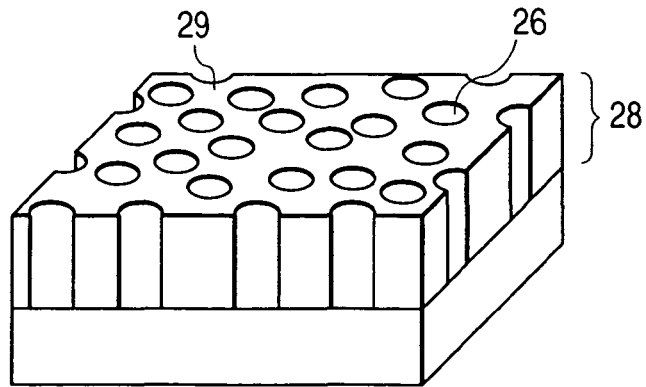

Now, a method of manufacturing an oxide porous body according to the invention will be described below in detail. A method of manufacturing an oxide porous body according to the invention is characterized in that it comprises a step of preparing a structural body formed so as to contain a first material and a second material and including pillar-shaped members formed so as to contain the first material and surrounded by an amorphous region formed so as to contain the second material (FIG. 2A), a removal step of removing the pillar-shaped members from the structural body (FIG. 2B) and a step of oxidizing the region (FIG. 2C). In FIG. 2A, reference symbols 21, 22, 23 and 24 respectively denote pillar-shaped members, a substrate, a structural body and a region surrounding the pillar-shaped members.

Preferably, the structural body contains the second material at a ratio of not smaller than 20 atomic % and not greater than 70 atomic % relative to the total quantity of the first and second materials. However, the present invention is by no means limited to the above ratio so long as the pillar-shaped members standing perpendicularly relative to the substrate are distributed in the surrounding region of the structural body. For the purpose of the invention, it is important that the structural body is obtained by combining materials that are suited for selectively removing the pillar-shaped members from the structural body.

Figure 2D:
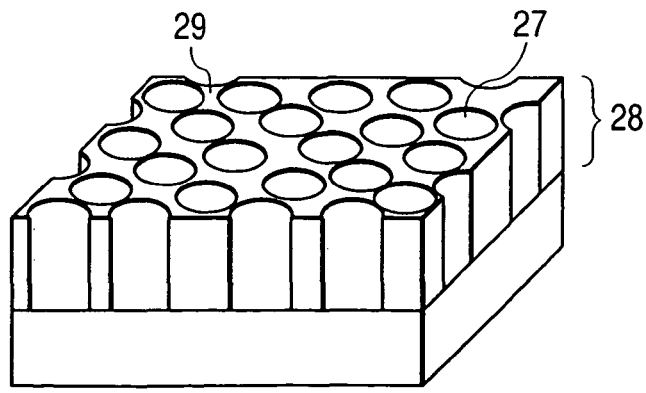

If necessary, a pore diameter enlarging step of enlarging the pore diameters of the porous body may be conducted after the removal step (FIG. 2D). Of course, the oxidizing step may be conducted after the pore diameter enlarging step that comes after the removal step.

For example, aluminum or gold may be used as the first material, whereas Si, SiGe, Ge, or a material of a combination of any of them may be used as the second material. Of course, a plurality of materials may be combined for use for the purpose of the invention. Whenever appropriate, this statement applies to the following description.

Figure 3:
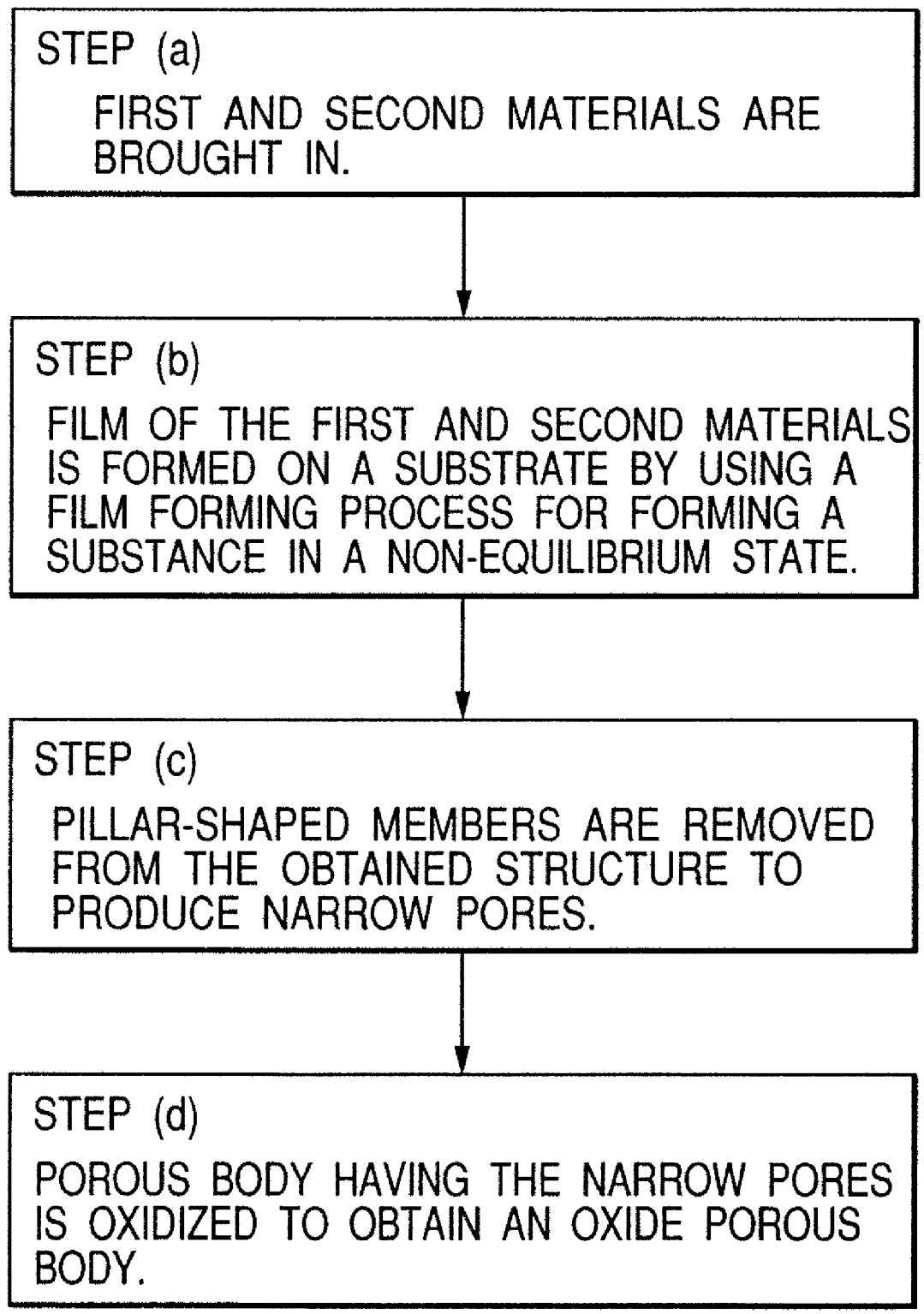
FIG. 3 is a schematic illustration of another mode of carrying out a method of manufacturing an oxide porous body according to the invention, showing different steps thereof.

FIG. 3 is a schematic illustration of a mode of carrying out a method of manufacturing an oxide porous body according to the invention, showing different steps thereof. Referring to FIG. 3, a method of manufacturing an oxide porous body according to the invention is characterized by comprising Step (a), Step (b), Step (c) and Step (d), which will be described below.

Step (a): Firstly, the first material (e.g., aluminum) and the second material (e.g., silicon) are brought in.

Step (b): Then, a structural body is formed from the first material and the second material on a substance by using a film forming process for forming a substrate in a non-equilibrium state. The structural body obtained as a result of the film forming process comprises pillar-shaped members containing the first material and a region formed from the second material to surround the pillar-shaped members. The pillar-shaped members are distributed in the structural body when the film-shaped structural body is formed so as to contain the second material to a ratio of 20 to 70 atomic % relative to the total quantity of the first and second materials.

Step (c): Subsequently, the pillar-shaped members are removed from the structural body by etching to produce narrow pores. When the structural body is subjected to a wet etching process using acid or alkali, the pillar-shaped members are selectively removed to produce a porous body having narrow pores.

Step (d): Thereafter, the porous body having the narrow pores is oxidized to obtain an oxide porous body.

The step (e) of enlarging the pore diameters of the oxide porous body may be conducted by means of wet etching using acid or alkali after the step (d).

FIG. 4 is a schematic illustration of another mode of carrying out a method of manufacturing an oxide porous body according to the invention, showing different steps thereof.

Referring to FIG. 4, a method of manufacturing an oxide porous body according to the invention is characterized by comprising Steps (a), (b), (c), (e') and (d), which will be described below.

Step (a): Firstly, the first material (e.g., aluminum) and the second material (e.g., silicon) are brought in.

Step (b): Then, a structural body is formed from the first material and the second material on a substrate by using a film forming process for forming a substrate in a non-equilibrium state. The structural body obtained as a result of the film forming process comprises pillar-shaped members containing the first material and a region formed from the second material to surround the pillar-shaped members and contains the second material to a ratio of 20 to 70 atomic % relative to the total quantity of the first and second materials.

Step (c): Subsequently, the pillar-shaped members are removed from the structural body by etching to produce a porous body. When the structural body is subjected to a wet etching process using acid or alkali, the pillar-shaped members that contain the first material are etched away to produce a porous body having narrow pores.

Step (e'): Then, the pore diameters of the narrow pores of the produced porous body are enlarged by wet etching using acid or alkali.

Step (d): Thereafter, the porous body having the narrow pores whose pore diameters have been enlarged is oxidized to obtain an oxide porous body.

Now, a method of manufacturing an oxide porous body according to the invention will be described by referring to the related drawings. FIGS. 5A, 5B, 5C, 5D and 5E and FIGS. 6A, 6B, 6C, 6E and 6D are schematic illustrations of still other modes of carrying out a method of manufacturing an oxide porous body according to the invention, showing different steps thereof.

The steps (a), (b), (c), (d) and (e) described below correspond respectively to FIGS. 5A, 5B, 5C, 5D and 5E and FIGS. 6A, 6B, 6C, 6D and 6E.

Step (a): Firstly, the first material (e.g., aluminum) and the second material (e.g., silicon) are brought in (FIG. 5A, FIG. 6A).

The raw materials including the first and second materials are arranged in such a way that chips 13 made of the second material are placed on a target 12 made of the first material as shown in FIG. 7.

Figure 5B:
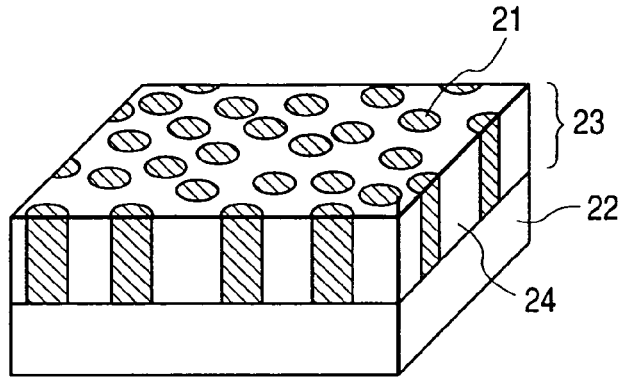
Figure 6B:
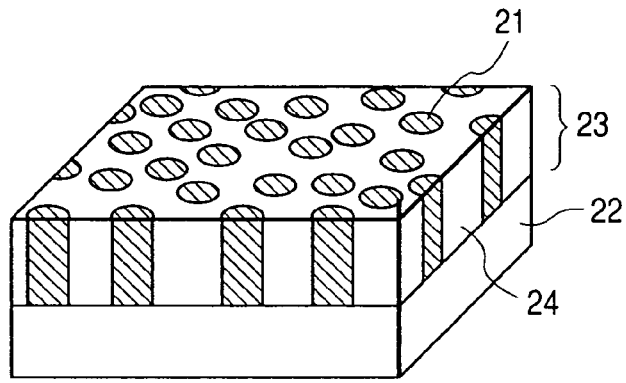

Step (b): Formation of a Structural Body (FIG. 5B, FIG. 6B)

Then, a structural body 23 is formed on the substrate 22. Here, a sputtering process is used as film forming process to be conducted in a non-equilibrium state.

A structural body 23 is formed on the substrate 22 by means of a magnetron sputtering process that is a film forming process to be conducted in a non-equilibrium state. The structural body 23 comprises pillar-shaped members 21 showing a composition of containing the first material as principal ingredient and a region 24 surrounding the pillar-shaped members 21 and containing the second material as principal ingredient.

Now, a method of forming a structural body 23 by sputtering will be described by referring to FIG. 7 as a film forming method for forming a film in a non-equilibrium state. In FIG. 7, reference symbols 11 and 12 respectively denote a substrate and a sputtering target made of the first material. A sputtering method provides an advantage that the content ratio of the first material relative to the second material or vice versa can be changed with ease.

A structural body 23 is formed on the substrate 11 by means of a magnetron sputtering process that is a film forming process as shown in FIG. 7 to be conducted in a non-equilibrium state.

The raw materials including the first and second materials are placed in position when chips 13 made of the second material are arranged on a target 12 made of the first material as shown in FIG. 7. While the second material is arranged so as to take the form of a plurality of chips in FIG. 7, the present invention is by no means limited thereto and a single chip may alternatively be used if a desired film is formed with it. However, chips are preferably arranged symmetrically (e.g., on coaxial circles) on the substrate 11 to distribute uniformly pillar-shaped members in the region 24.

A predetermined quantity of the first material and also a predetermined quantity of the second material that are in powdery form may be sintered and the sintered product may be used as target in the film forming operation.

Alternatively, a target made of the first material and a target made of the second material may be separately prepared, and both of the targets may simultaneously be subjected to a sputtering.

The quantity ratio of the second material in the film-shaped produced structural body is 20 to 70 atomic %, preferably 25 to 65 atomic %, more preferably 30 to 60 atomic %, relative to the total quantity of the first and second materials. A structural body 23 in which pillar-shaped members are distributed in the region 24 is obtained when the quantity ratio of the second material is found within the above range.

The expression of atomic % for indicating the ratio of the second material relative to the first material or vice versa as used herein refers, for example, to the ratio of the number of silicon atoms to that of aluminum atoms. It may also be expressed as atom % or at %. For the purpose of the present invention, the atomic % can be determined by subjecting the second material and the first material contained in a structural body to quantitative analysis typically using inductively coupled plasma atomic emission spectrometry.

While atomic % is used as unit for expressing a quantity ratio for the purpose of the invention, the expression of not smaller than 20 atomic % and not greater than 70 atomic % may be paraphrased as not smaller than 20.65 wt % and not greater than 70.84 wt % if wt % is used as unit (an atomic weight of 26.982 is used for Al and an atomic weight of 28.086 is used for Si to determine the weight ratio of Al and Si and the value of the ratio expressed by wt % can be determined by using the formula of (weight ratio)× (atomic %)).

For the purpose of the invention, the substrate temperature is not higher than 300° C. Preferably, it is not higher than 200° C.

When a structural body is formed by the above described method, the first and second materials come to show a metastable eutectic texture and the first material forms nanostructures (pillar-shaped members) having dimensions of several nanometers in a matrix formed from the second material so that the first material and the second material are separated from each other in a manner of self-organization. At this time, the pillar-shaped members of the first material show a substantially cylindrical profile with diameters between 1 and 10 nm and intercentral gaps between 3 and 15 nm.

The quantity ratio of the second material contained in the structural body can be controlled by appropriately selecting the number and/or the volume of the chips of the second material that are to be put on the target made of the first material.

When the film forming process is conducted in a non-equilibrium state, particularly by means of sputtering, the internal pressure of the reactor is preferably between 0.2 and 1 Pa or between 0.1 and 1 Pa when argon gas is made to flow in it and the power output for forming plasma is preferably between 150 and 1,000 W if a 4-inch target is used. However, the present invention is by no means limited to such values so long as the pressure and the output power are such that argon plasma is generated on a stable basis. Particularly, it is desirable that the sputtering process is conducted for forming a film in such a condition that plasma does not practically contact the substrate on which a film is to be formed.

Substrates that can be used for the purpose of the invention include insulating substrates such as quartz glass substrates and plastic substrates, semiconductor substrates such as silicon substrates and gallium arsenide substrates, metal substrates and substrates on which one or more than one film layers are formed. There are no limitations to the material, the thickness and the mechanical strength of the substrate so long as they are not disadvantageous to forming an aluminum/silicon structural body. As for the profile of substrate, not only plate-shaped flat substrates but also those having a curved surface and those having undulations or steps to a certain extent may also be used for the purpose of the invention. In short, there are no limitations to the substrate so long as it is not particularly disadvantageous to the aluminum/silicon structural body to be formed on it.

While sputtering is most desirable as method for forming a substance in a non-equilibrium state for the purpose of the invention, any film forming process for forming a substance in a non-equilibrium state such as resistance heating evaporation or electron beam evaporation (EB evaporation) may be applicable to the present invention.

For the purpose of the invention, a film forming process in which the second material and the first material are formed simultaneously or a multiplayer film forming process in which several atomic layers of the second material and those of the first material are formed may be used.

The structural body 23 that is formed as film in a manner as described above comprises pillar-shaped members 21 showing a composition of containing the first material as principal ingredient and a region 24 surrounding the pillar-shaped members 21 and containing the second material as principal ingredient.

While the pillar-shaped members 21 contain the first material as principal ingredient, it may additionally contain other elements such as silicon, oxygen and/or argon so long as pillar-shaped microstructures are obtained. The expression of principal ingredient is used for the first material when the compositional ratio of the first material in the pillar-shaped members is not smaller than 80 atomic % or not smaller than 90 atomic %.

On the other hand, while the region 24 surrounding the pillar-shaped members that contains the first material contains the second material as principal ingredient, it may also additionally contain other elements such as aluminum, oxygen and/or argon so long as pillar-shaped microstructures are obtained. The expression of principal ingredient is used for the second material when the compositional ratio of the second material in the region 24 is not smaller than 80 atomic % or not smaller than 90 atomic %.

Figure 5C:
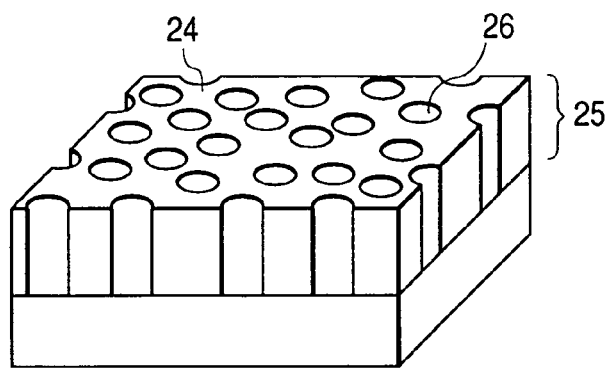
Figure 6C:
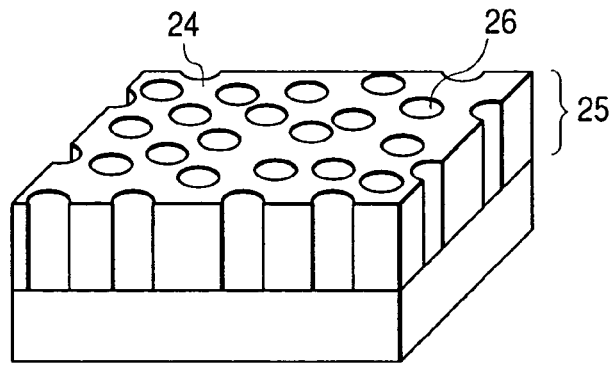

Step (c): Narrow Pore Forming Step (FIG. 5C, FIG. 6C)

The pillar-shaped members in the above structural body 23 are selectively removed. As method for removing the pillar-shaped members 21, wet etching that utilizes acid or alkali in order to selectively dissolve the first material is preferably used. As a result of this step, the region 24 containing narrow pores 26 is mainly left in the structural body to produce a porous body 25. While the narrow pores in the porous body 25 show intercentral gaps 2R not greater than 30 nm and pore diameters 2r not greater than 20 nm, it is preferable that the narrow pores show pore diameters 2r within a range between 1 and 15 nm and intercentral gaps 2R within a range between 5 and 20 nm. The length L of the narrow pores is within a range between 1 nm and several micrometers. It is sufficient for the pillar-shaped members 21 to be practically removed when they are selectively removed.

The solution to be used for wet etching for the purpose of the invention may be selected from solutions of acids such as phosphoric acid, sulfuric acid, hydrochloric acid and chromic acid that dissolve the first material, which is aluminum, but practically does not dissolve the second material, which is silicon. However, alkalis such as sodium hydroxide may also be used for the wet etching process if they are not disadvantageous for forming narrow pores by etching. Furthermore, there are no limitations to the types of acid and alkali to be used for the wet etching process. A mixture of solutions of several different acids or that of solutions of several different alkalis may also be used. The etching conditions including the temperature and the concentration of the solution and the processing time may be appropriately defined depending on the porous body to be prepared.

Figure 5D:
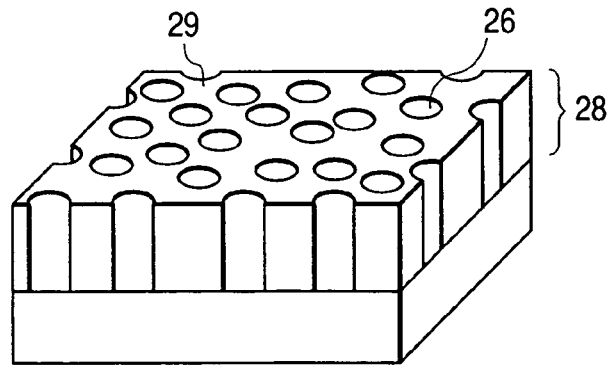
Figure 6E:
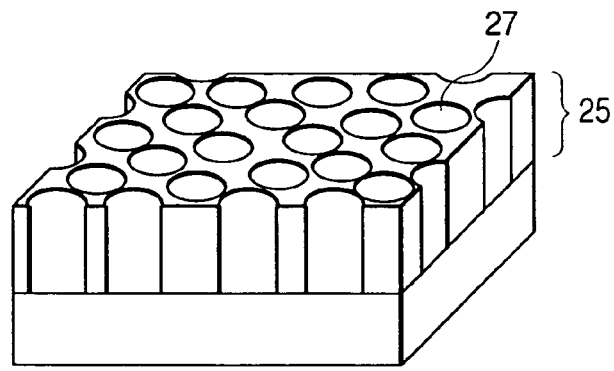
Figure 6D:
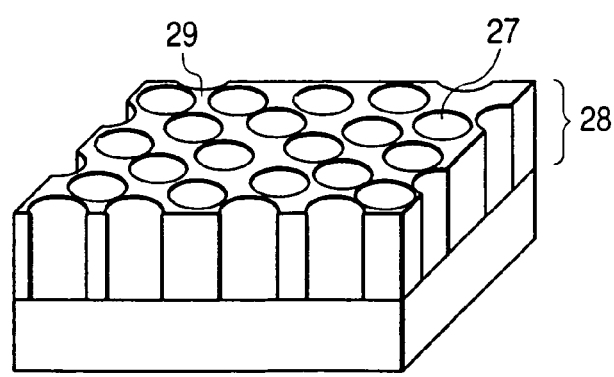

Step (d): Oxidization of the Porous Body (FIG. 5D, FIG. 6D)

The porous body 25 prepared as a result of the step (c) can be oxidized by heating it in an oxygen atmosphere, in steam or in air. Alternatively, anodic oxidization or any oxidizing method such as exposing the porous body 25 to oxygen plasma may be used. The second material in the porous body is oxidized to produce an oxide region 29 so that consequently an oxide porous body 28 is obtained. It is also possible to oxidize the porous body simultaneously with the step (c) when acid or alkali that contains water to a large extent is used. While the present invention is described in terms of oxidizing the porous body, the oxidization process may be replaced by a nitriding process whenever necessary.

For the purpose of the present invention, an oxide porous body may be obtained by heating the porous body in an oxygen atmosphere after enlarging the narrow pores of the porous body 25 formed in the step (c). The duration of the oxidization process may be reduced when all the pore walls do not need to be oxidized.

Steps (e) and (e'): Enlargement of the Pore Diameters of the Narrow Pores (FIG. 5E, FIG. 6E)

Figure 5E:
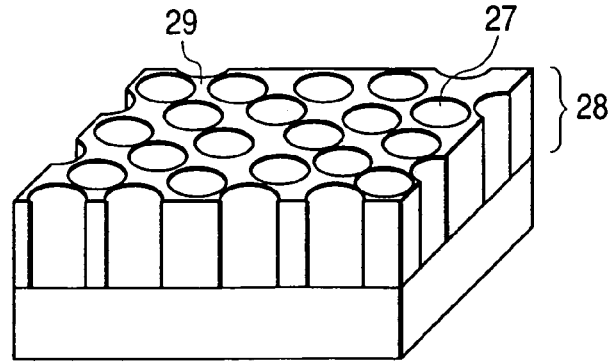

As shown in FIG. 5E, the narrow pores of the oxide porous body prepared in the step (d) are enlarged in the enlarging step (e). Or, as shown in FIG. 6E, the narrow pores of the porous body 25 prepared in the step (c) are enlarged in the enlarging step (e').

The pore diameters of the narrow pores can be appropriately enlarged by means of a pore widening process (pore diameter enlarging process) of immersing the porous body or the oxide porous body in an acid solution (e.g., a dilute solution of hydrofluoric acid) or in an alkaline solution (e.g., a sodium hydroxide solution) that dissolves the porous body.

Any acid or alkaline solution may be used for the above process so long as it does not give rise to any problem for enlarging the pore diameters. A mixture of several different types of acid or alkaline solutions may also be used for the purpose of the invention.

The conditions under which the pore diameters are enlarged (the pores are widened) including the temperature and the concentration of the solution and the processing time may be appropriately defined depending on the sizes of the pores to be produced.

Thus, as described above, in a method of manufacturing an oxide porous body according to the invention, the pore diameters may be enlarged after preparing a porous body and subsequently oxidizing the porous body or after preparing a silicon oxide porous body.

(4-1) Method of Manufacturing a Silicon Oxide Porous Body

A method of manufacturing a silicon oxide porous body according to the invention is characterized by comprising a step of preparing an aluminum/silicon structural body formed so as to contain aluminum and silicon and including pillar-shaped members formed so as to contain aluminum and a silicon region surrounding the pillar-shaped members, the structural body containing silicon at a ratio of not smaller than 20 atomic % and not greater than 70 atomic % relative to the total quantity of aluminum and silicon, a removal step of removing the pillar-shaped members containing aluminum from the aluminum/silicon structural body and a step of oxidizing the aluminum/silicon structural body simultaneously with or after the removal step.

The method of manufacturing a silicon oxide porous body may preferably comprise (a) a step of bringing in aluminum and silicon, (b) a step of preparing an aluminum/silicon structural body by means of a film forming process of forming a substance in a non-equilibrium state from aluminum and silicon in such a way that the structural body includes pillar-shaped members formed so as to contain aluminum and a silicon region surrounding the pillar-shaped members, the structural body containing silicon at a ratio of not smaller than 20 atomic % and not greater than 70 atomic % relative to the total quantity of aluminum and silicon, (c) a step of forming a silicon porous body having narrow pores by etching the aluminum/silicon structural body and (d) a step of oxidizing the silicon porous body having narrow pores.

The method of manufacturing a silicon oxide porous body may preferably comprise (a) a step of bringing in aluminum and silicon, (b) a step of preparing an aluminum/silicon structural body by means of a film forming process of forming a substance in a non-equilibrium state from aluminum and silicon in such a way that the structural body includes pillar-shaped members formed so as to contain aluminum and a silicon region surrounding the pillar-shaped members, the structural body containing silicon at a ratio of not smaller than 20 atomic % and not greater than 70 atomic % relative to the total quantity of aluminum and silicon, (c) a step of forming a silicon porous body having narrow pores by etching the aluminum/silicon structural body, (d) a step of oxidizing the silicon porous body having narrow pores and (e) a step of enlarging the pore diameters of the narrow pores.

The method of manufacturing a silicon oxide porous body may preferably comprise (a) a step of bringing in aluminum and silicon, (b) a step of preparing an aluminum/silicon structural body by means of a film forming process of forming a substance in a non-equilibrium state from aluminum and silicon in such a way that the structural body includes pillar-shaped members formed so as to contain aluminum and a silicon region surrounding the pillar-shaped members, the structural body containing silicon at a ratio of not smaller than 20 atomic % and not greater than 70 atomic % relative to the total quantity of aluminum and silicon, (c) a step of forming a silicon porous body having narrow pores by etching the aluminum/silicon structural body, (e') a step of enlarging the pore diameters of the narrow pores and (d) a step of oxidizing the silicon porous body having narrow pores.

It is preferable that wet etching using acid or alkali is employed for the step of widening the pores.

It is preferable that thermal oxidation or oxidation using an aqueous solution is employed for the oxidizing step.

It is preferable that sputtering is employed for the film forming process of forming a substance in a non-equilibrium state.

(4-2) Method of Manufacturing a Germanium Oxide Porous Body

A method of manufacturing a germanium oxide porous body according to the invention is characterized by comprising a step of preparing an aluminum/germanium structural body formed so as to contain aluminum and germanium and including pillar-shaped members formed so as to contain aluminum and a germanium region surrounding the pillar-shaped members, the structural body containing germanium at a ratio of not smaller than 20 atomic % and not greater than 70 atomic % relative to the total quantity of aluminum and germanium, a removal step of removing the pillar-shaped members containing aluminum from the aluminum/germanium structural body and a step of oxidizing the aluminum/germanium structural body.

The method of manufacturing a germanium oxide porous body may preferably comprise (a) a step of bringing in aluminum and germanium, (b) a step of preparing an aluminum/germanium structural body by means of a film forming process of forming a substance in a non-equilibrium state from aluminum and germanium in such a way that the structural body includes pillar-shaped members formed so as to contain aluminum and a germanium region surrounding the pillar-shaped members, the structural body containing germanium at a ratio of not smaller than 20 atomic % and not greater than 70 atomic % relative to the total quantity of aluminum and germanium, (c) a step of forming a germanium porous body having narrow pores by etching the aluminum/germanium structural body and (d) a step of oxidizing the germanium porous body having narrow pores.

The method of manufacturing a germanium oxide porous body may preferably comprise (a) a step of bringing in aluminum and germanium, (b) a step of preparing an aluminum/germanium structural body by means of a film forming process of forming a substance in a non-equilibrium state from aluminum and germanium in such a way that the structural body includes pillar-shaped members formed so as to contain aluminum and a germanium region surrounding the pillar-shaped members, the structural body containing germanium at a ratio of not smaller than 20 atomic % and not greater than 70 atomic % relative to the total quantity of aluminum and germanium, (c) a step of forming a germanium porous body having narrow pores by etching the aluminum/germanium structural body, (d) a step of oxidizing the germanium porous body having narrow pores and (e) a step of enlarging the pore diameters of the narrow pores.

The method of manufacturing a germanium oxide porous body may preferably comprise (a) a step of bringing in aluminum and germanium, (b) a step of preparing an aluminum/germanium structural body by means of a film forming process of forming a substance in a non-equilibrium state from aluminum and germanium in such a way that the structural body includes pillar-shaped members formed so as to contain aluminum and a germanium region surrounding the pillar-shaped members, the structural body containing germanium at a ratio of not smaller than 20 atomic % and not greater than 70 atomic % relative to the total quantity of aluminum and germanium, (c) a step of forming a germanium porous body having narrow pores by etching the aluminum/germanium structural body, (e') a step of enlarging the pore diameters of the narrow pores and (d) a step of oxidizing the germanium porous body having narrow pores.

It is preferable that wet etching using acid or alkali is employed for the step of widening the pores.

It is preferable that thermal oxidation or oxidation using an aqueous solution is employed for the oxidizing step.

It is preferable that sputtering is employed for the film forming process of forming a substance in a non-equilibrium state.

(4-3) Method of Manufacturing a Silicon Germanium Oxide Porous Body

A method of manufacturing a silicon germanium oxide porous body according to the invention is characterized by comprising a step of preparing an aluminum/silicon germanium structural body formed so as to contain aluminum and silicon germanium and including pillar-shaped members formed so as to contain aluminum and a silicon germanium region surrounding the pillar-shaped members, the structural body containing silicon and germanium at a ratio of not smaller than 20 atomic % and tot greater than 70 atomic % relative to the total quantity of aluminum, silicon and germanium, a removal step of removing the pillar-shaped members containing aluminum from the aluminum/silicon germanium structural body and a step of oxidizing the aluminum/silicon germanium structural body simultaneously with or after the removal step.

The method of manufacturing a silicon germanium oxide porous body may preferably comprise (a) a step of bringing in aluminum, silicon and germanium, (b) a step of preparing an aluminum/silicon germanium structural body by means of a film forming process of forming a substance in a non-equilibrium state from aluminum, silicon and germanium in such a way that the structural body includes pillar-shaped members formed so as to contain aluminum and a silicon germanium region surrounding the pillar-shaped members, the structural body containing silicon and germanium at a ratio of not smaller than 20 atomic % and not greater than 70 atomic % relative to the total quantity of aluminum, silicon and germanium, (c) a step of forming a silicon germanium porous body having narrow pores by etching the aluminum/silicon germanium structural body and (d) a step of oxidizing the silicon germanium porous body having narrow pores.

The method of manufacturing a silicon germanium oxide porous body may preferably comprise (a) a step of bringing in aluminum, silicon and germanium, (b) a step of preparing an aluminum/silicon germanium structural body by means of a film forming process of forming a substance in a non-equilibrium state from aluminum, silicon and germanium in such a way that the structural body includes pillar-shaped members formed so as to contain aluminum and a silicon germanium region surrounding the pillar-shaped members, the structural body containing silicon and germanium at a ratio of not smaller than 20 atomic % and not greater than 70 atomic % relative to the total quantity of aluminum, silicon and germanium, (c) a step of forming a silicon germanium porous body having narrow pores by etching the aluminum/silicon germanium structural body, (d) a step of oxidizing the silicon germanium porous body having narrow pores and (e) a step of enlarging the pore diameters of the narrow pores.

The method of manufacturing a silicon germanium oxide porous body may preferably comprise (a) a step of bringing in aluminum, silicon and germanium, (b) a step of preparing an aluminum/silicon germanium structural body by means of a film forming process of forming a substance in a non-equilibrium state from aluminum, silicon and germanium in such a way that the structural body includes pillar-shaped members formed so as to contain aluminum and a silicon germanium region surrounding the pillar-shaped members, the structural body containing silicon and germanium at a ratio of not smaller than 20 atomic % and not greater than 70 atomic % relative to the total quantity of aluminum, silicon and germanium, (c) a step of forming a silicon germanium porous body having narrow pores by etching the aluminum/silicon germanium structural body, (e') a step of enlarging the pore diameters of the narrow pores and (d) a step of oxidizing the silicon germanium porous body having narrow pores.

It is preferable that wet etching using acid or alkali is employed for the step of widening the pores.

It is preferable that thermal oxidation or oxidation using an aqueous solution is employed for the oxidizing step.

It is preferable that sputtering is employed for the film forming process of forming a substance in a non-equilibrium state.

(5) Other Methods of Preparing an Oxide Porous Body

Apart from using any of the above described methods for obtaining an oxide porous body, it is also possible to form a porous body and oxidizing it substantially simultaneously by subjecting a structural body to anodic oxidation.

Figure 8:
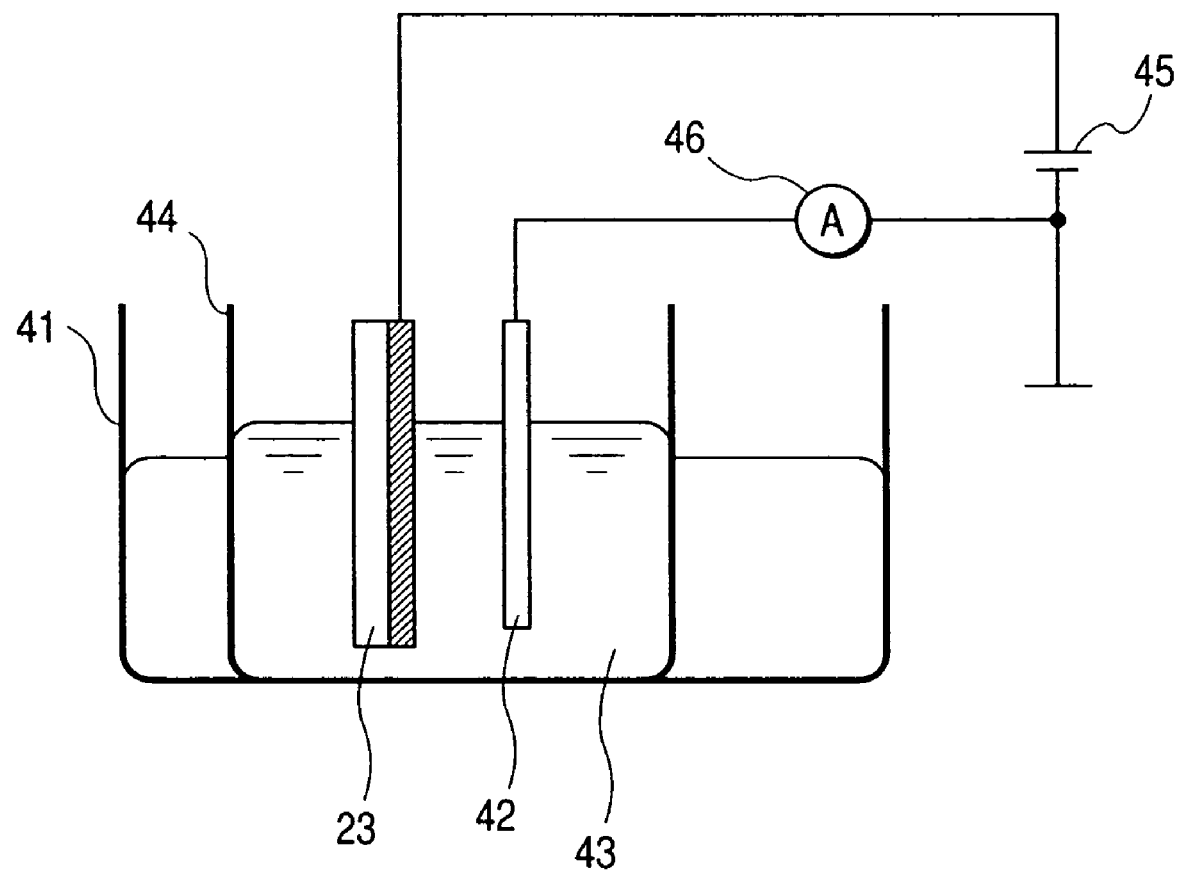
FIG. 8 is a schematic illustration of an anodic oxidation system that can be used for the purpose of the invention.

FIG. 8 is a schematic illustration of an anodic oxidation system that can be used for the purpose of the invention. In FIG. 8, there are shown a structure body 23 (a structure body typically containing aluminum as the first material that is used for pillar-shaped members and silicon that is used for a region surrounding the pillar-shaped members), a thermostat-controlled tank 41, a Pt plate cathode 42, electrolytic solution 43, a reaction container 44, a power source 45 for applying an anodic oxidation voltage and an ammeter 46 for measuring the anodic oxidation current. Although not shown, the system additionally comprises a computer for automatically controlling and measuring the voltage and the electric current.

The structural body 23 and the cathode 42 are arranged in the electrolytic solution 43 whose temperature is held to a constant level by the thermostat-controlled tank 41 and anodic oxidation takes place as a voltage is applied between the aluminum/silicon composite film 23 and the cathode 42 from the power source 45.

The electrolytic solution to be used for the anodic oxidation may be selected from solutions of oxalic acid, phosphoric acid, sulfuric acid, nitric acid and chromic acid, although any electrolytic solution may be used for the purpose of the invention if it is not disadvantageous for forming pores by anodic oxidation. The conditions under which the anodic oxidation is conducted including the anodic oxidation voltage and the temperature may be selected appropriately depending on the electrolytic solution to be used and the oxide porous body to be manufactured.

As a result of the anodic oxidation, aluminum is removed from the structural body to produce narrow pores and at the same time, the silicon in the silicon region is oxidized to produce a silicon oxide region. Thus, the silicon oxide region having narrow pores is left in the structural body so that consequently a silicon oxide porous body is produced. As for the intercentral gaps and the diameters of the narrow pores of the silicon oxide porous body, the intercentral gaps $2R$ are not greater than 15 nm and the pore diameters $2r$ are not greater than 10 nm. Alternatively, the narrow pore diameters $2r$ may be within a range between 1 and 9 nm and the intercentral gaps $2R$ may be within a range between 3 and 10 nm. The length L of the narrow pores is within a range between 2 nm and several micrometers. The step of enlarging the pore diameters of the porous layer may be conducted after the anodic oxidation step. For instance, the pore diameters of the narrow pores can be appropriately enlarged by means of a pore widening process (pore diameter enlarging process) of immersing the porous body or the oxide porous body in an acid solution (e.g., a dilute solution of hydrofluoric acid) or in an alkaline solution (e.g., a sodium hydroxide solution) that dissolves the porous body.

Any acid or alkaline solution may be used for the above process so long as it does not give rise to any problem for enlarging the pore diameters. A mixture of several different types of acid or alkaline solutions may also be used for the purpose of the invention.

The conditions under which the pore diameters are enlarged (the pores are widened) including the temperature and concentration of the solution and the processing time may be appropriately defined depending on the sizes of the pores to be produced.

(History of the Present Invention)

As a result of researches on microstructures conducted by the inventors of the present invention, they came to acquire the following findings.

In an experiment for forming an aluminum film on a substrate by means of a film forming method of forming a substance in a non-equilibrium state such as sputtering, the inventors added silicon and found that pillar-shaped structures of aluminum can be formed in a silicon matrix in a manner of self-formation under certain conditions. The inventors paid intensive research efforts on the basis of the above finding to succeed in this invention.

The reason why a film forming method of forming a substance in a non-equilibrium state is used in a step of forming an aluminum/silicon structural body is that an aluminum/silicon structural body formed in a non-equilibrium state shows a eutectic texture in which aluminum and silicon are in a metastable state and aluminum forms nanostructures (pillar-shaped structures of aluminum) having a diameter of several nanometers, which separate themselves in a manner of self-organization.

The reason why an aluminum/silicon film containing silicon by 20 to 70 atomic % relative to the total quantity of aluminum and silicon is formed according to the invention is that aluminum produces pillar-shaped nanostructures only when the silicon content ratio is found within the above defined range. In other words, if the silicon content ratio is less than 20 atomic % relative to the total quantity of aluminum and silicon, the diameters or sizes of the produced structures that contain aluminum exceeds 20 nm and no pillar-shaped members containing aluminum are produced. If, on the other hand, the silicon content ratio is more than 70 atomic % relative to the total quantity of aluminum and silicon, no pillar-shaped members containing aluminum can be found by way of an ordinary electron microscope.

The pillar-shaped members showing a pillar-shaped structure and containing aluminum in an aluminum/silicon structural body can be selectively etched away by using phosphoric acid, sulfuric acid or hydrochloric acid. As a result, narrow pores (nanoholes) can be produced in the silicon of the structural body. Preferably, the etching is wet etching using acid or alkali.

Preferably, the film forming method for forming a substance in a non-equilibrium state to be used for a method of manufacturing a silicon oxide porous body according to the invention is a sputtering method. When sputtering is used for a film forming method of forming a substance in a non-equilibrium state, the compositional ratio of aluminum and that of silicon can be maintained reliably with ease if compared with the use of a vacuum evaporation method. Additionally, the prepared silicon porous body having narrow pores can be entirely turned into silicon oxide when it is subjected to an oxidation process. In the oxidation process, preferably, not only the surface of the narrow pore walls and neighboring areas thereof but also the inside of the pore walls are turned into silicon oxide.

The pore diameters of the produced narrow pores (nanoholes) can be enlarged by immersing the porous body into a solution that can dissolve silicon or silicon oxide on the surface of the narrow pores. Preferably, wet etching using acid or alkali is employed for the step of enlarging the pore diameters.

For the purpose of the present invention, pillar-shaped members containing aluminum are also expressed as "aluminum pillar-shaped members".

A silicon porous body according to the invention is characterized by having pillar-shaped narrow pores and a silicon region surrounding them, the average diameter of the narrow pores being not smaller than 0.5 nm and not greater than 20 nm and the average intercentral distance of the narrow pores being not greater than 30 nm.

Preferably, the average diameter is not smaller than 0.5 nm and not greater than 15 nm, and the average intercentral distance is not greater than 20 nm.

While history of the present invention is described in terms of the use of aluminum as the first material for forming pillar-shaped structures and that of silicon as the second material for forming a region surrounding the pillar-shaped structures, the present invention is also applicable to the use of SiGe, Ge or a material of a combination of them.

EXAMPLES

Now, the present invention will be described in greater detail by way of examples.

Example 1

Figure 9:
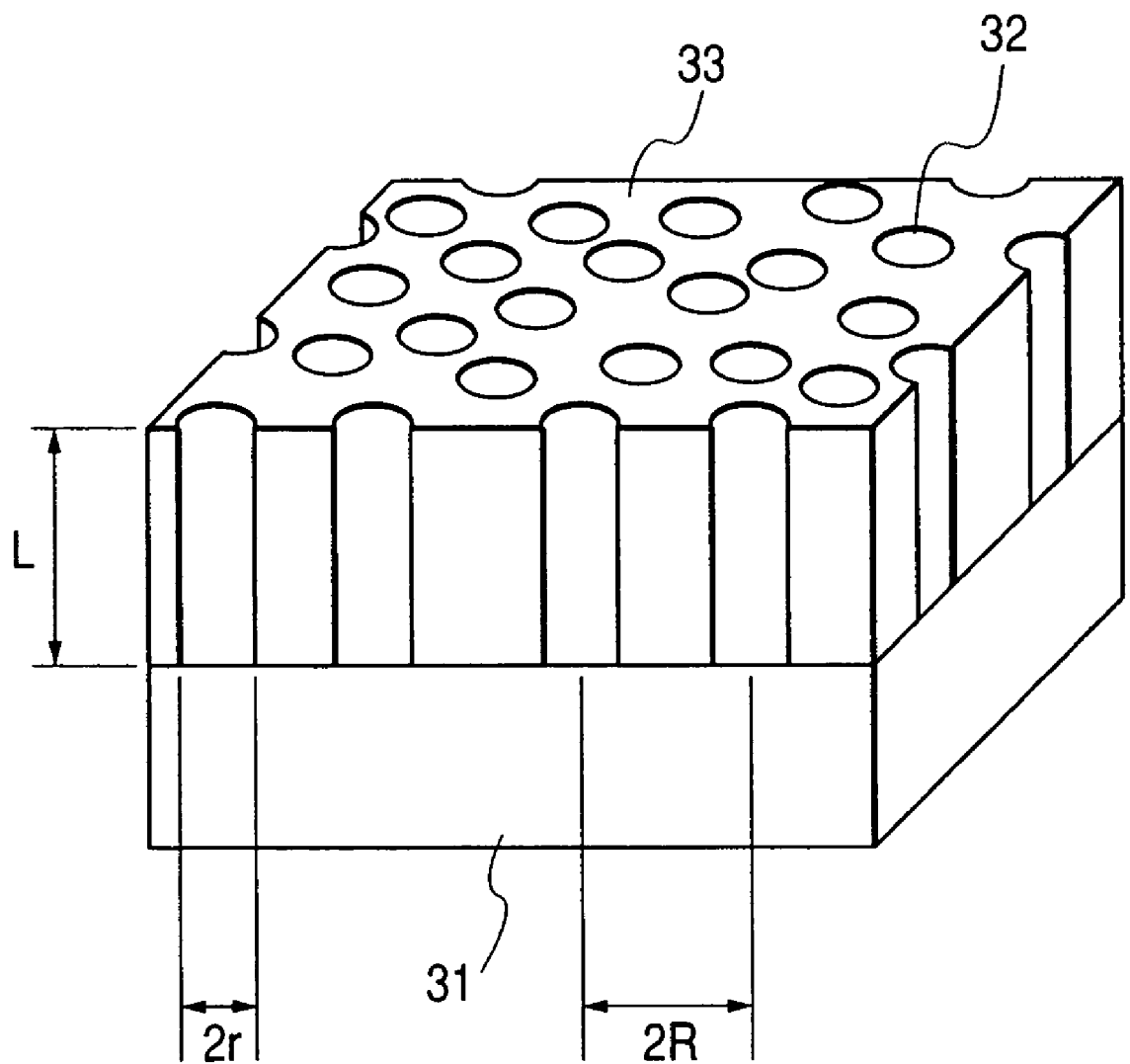
FIG. 9 is a schematic illustration of an embodiment of oxide porous body according to the invention.

In this example, a specimen of silicon oxide porous body having narrow pores with an average intercentral gap $2R$ separating pores of 8 nm, an average pore diameter $2r$ of 5 nm and a height L of 200 nm as shown in FIG. 9 was prepared.

As shown in FIG. 7, an aluminum/silicon structural body containing silicon by 37 atomic % relative to the total quantity of aluminum and silicon was formed on a glass substrate to a thickness of 200 nm by magnetron sputtering. The target was prepared by placing six 15 mm square silicon chips on a cylindrical aluminum target having a diameter of 4 inches (101.6 mm). The sputtering conditions were as follows. An RF power source was used with Ar flow rate: 50 sccm, discharge pressure: 0.7 Pa and supplied power: 1 kW. The substrate was held at room temperature (25° C.).

While a target prepared by placing six silicon chips on an aluminum target was used in this example, the number of silicon chips is not limited to six. In other words, it is only necessary that the silicon content in the aluminum/silicon structural body is somewhere around 37 atomic % and therefore the number of chips may be changed depending on the sputtering conditions. Furthermore, the target is not limited to one prepared by placing silicon chips on an aluminum target and a target prepared by putting aluminum chips on a silicon target or one prepared by sintering silicon and aluminum may alternatively be used.

When the aluminum/silicon structural body was observed through an FE-SEM (field emission scanning electron microscope), it was found that pillar-shaped members having a cylindrical cross section and containing aluminum were two-dimensionally arranged and surrounded by a silicon region as shown in FIG. 5B. The diameter of the pillar-shaped members containing aluminum was 6 nm and the average intercentral gap of the pillar-shaped members was 8 nm. The height of the aluminum/silicon structural body was 200 nm. The pillar-shaped members containing aluminum were separated from each other by means of a silicon region.

The aluminum/silicon structural body containing silicon by 37 atomic % relative to the total quantity of aluminum and silicon was immersed in 98% concentrated sulfuric acid for 24 hours so as to selectively etch away only the pillar-shaped members containing aluminum. As a result, a silicon nanostructure (silicon porous body) was produced.

After the etching operation using concentrated sulfuric acid, the aluminum/silicon structural body (silicon porous body) was observed through an FE-SEM (field emission scanning electron microscope). The plan view of the surface observed from right above the substrate revealed that narrow pores were two-dimensionally arranged and surrounded by a silicon region. The pore diameter of the narrow pores was 6 nm and the average intercentral gap of the narrow pores was 8 nm. When a cross section of the aluminum/silicon structural body was observed through the FE-SEM, it was found that the height of structural body was 200 nm and the narrow pores were separated from each other by the silicon region and hence independent. No film had been formed between the narrow pores and the substrate and the bottoms of the narrow pores were directly facing the substrate.

The silicon nanostructure (silicon porous body) prepared on a glass substrate in a similar manner was analyzed by Raman spectrometry to find that the silicon was amorphous silicon.

Finally, the prepared silicon nanostructure (silicon porous body) was heated in an oxygen atmosphere. More specifically, the specimen was heated at 800° C. for 2 hours, while oxygen was being made to flow at a rate of 50 sccm under the atmospheric pressure. As a result, a silicon oxide porous body was produced.

The oxidized silicon nanostructure (silicon porous body) was analyzed by electron energy loss spectroscopy analysis (EELS) to find that oxygen and silicon were mutually bonded in the specimen to prove that the silicon contained in the specimen was silicon oxide.

The prepared silicon oxide porous body was observed through an FE-SEM (field emission scanning electron microscope). The plan view of the surface observed from right above the substrate revealed that narrow pores were two-dimensionally arranged and surrounded by a silicon oxide region. The pore diameter of the narrow pores was 5 nm and the average intercentral gap of the narrow pores was about 8 nm. When a cross section of the silicon oxide porous body was observed through the FE-SEM, it was found that the height of porous body was 200 nm and the narrow pores were separated from each other by the silicon oxide region and hence independent. No film had been formed between the narrow pores and the substrate and the bottoms of the narrow pores were directly facing the substrate.

Thus, a silicon oxide porous body as shown in FIG. 9 was prepared. The silicon content ratio of the silicon oxide region was about 90 atomic % relative to all the atoms thereof except oxygen.

Example 2

In this example, a specimen of silicon oxide porous body having narrow pores with an average intercentral gap 2R separating pores of 7 nm and an average pore diameter 2r of 4 nm as shown in FIG. 9 was prepared.

As shown in FIG. 7, an aluminum/silicon structural body containing silicon by 45 atomic % relative to the total quantity of aluminum and silicon was formed on a glass substrate to a thickness of about 200 nm by magnetron sputtering. The target was prepared by placing eight 15 mm square silicon chips 13 on a cylindrical aluminum target having a diameter of 4 inches (101.6 mm). The sputtering conditions were as follows. An RF power source was used with Ar flow rate: 50 sccm, discharge pressure: 0.7 Pa and supplied power: 1 kW. The substrate was held at room temperature.

While a target prepared by placing eight silicon chips on an aluminum target was used in this example, the number of silicon chips is not limited to eight. In other words, it is only necessary that the silicon content in the aluminum/silicon structural body is somewhere around 45 atomic % and therefore the number of chips may be changed depending on the sputtering conditions. Furthermore, the target is not limited to one prepared by placing silicon chips on an aluminum target and a target prepared by putting aluminum chips on a silicon target or one prepared by sintering silicon and aluminum may alternatively be used.

When the aluminum/silicon structural body was observed through an FE-SEM (field emission scanning electron microscope), it was found that, when observed from right above the substrate, pillar-shaped members having a cylindrical cross section and containing aluminum were two-dimensionally arranged and surrounded by a silicon region as shown in FIG. 6B. The average diameter of the pillar-shaped members containing aluminum was about 3 nm and the average intercentral gap of the pillar-shaped members was about 7 nm. When a cross section of the aluminum/silicon structural body was observed through the FE-SEM, it was found that the height of structural body was 200 nm and the pillar-shaped members containing aluminum were independent from each other.

The aluminum/silicon structural body containing silicon by 45 atomic % relative to the total quantity of aluminum and silicon was immersed in 98% concentrated sulfuric acid for 24 hours so as to selectively etch away only the pillar-shaped members containing aluminum. As a result, a silicon nanostructure (silicon porous body) was produced.

The produced silicon nanostructure (silicon porous body) was observed through an FE-SEM (field emission scanning electron microscope). The perspective view of the specimen observed from above and showing the top surface was such that narrow pores were two-dimensionally arranged and surrounded by a silicon region. The average pore diameter of the narrow pores was about 3 nm and the average intercentral gap of the narrow pores was about 7 nm. When a cross section of the silicon nanostructure was observed through the FE-SEM, it was found that the height of structural body was 200 nm and the narrow pores were independent from each other.

Then, the silicon nanostructure was immersed in a solution containing sodium hydroxide by 1 mol/l held to 25° C. for 30 minutes to enlarge the pore diameters of the narrow pores.

After the pore diameter enlarging process, the silicon nanostructure (silicon porous body) was observed through an FE-SEM (field emission scanning electron microscope). The plan view of the surface observed from right above the substrate revealed that narrow pores were two-dimensionally arranged and surrounded by a silicon region. The pore diameter of the narrow pores observed was 5 nm and the average intercentral gap of the narrow pores was 7 nm, while the height of the silicon nanostructure was 200 nm. The narrow pores were separated from each other by the silicon region and hence independent. No film had been formed between the narrow pores and the substrate. The specimen was observed by X-ray diffractometry but it was not possible to confirm the existence of a peak that indicates the crystallinity of silicon. In other words, the silicon of the specimen was amorphous.

Finally, the prepared silicon nanostructure (silicon porous body) was heated in an oxygen atmosphere. More specifically, the specimen was heated at 800° C. for 2 hours, while oxygen was being made to flow at a rate of 50 sccm under the atmospheric pressure. As a result, a silicon oxide porous body was produced.

The prepared silicon oxide porous body was observed through an FE-SEM (field emission scanning electron microscope). The plan view of the surface observed from right above the substrate revealed that narrow pores were two-dimensionally arranged and surrounded by a silicon oxide region. The pore diameter of the narrow pores was 4 nm and the average intercentral gap of the narrow pores was about 7 nm. When a cross section of the silicon oxide porous body was observed through the FE-SEM, it was found that the height of porous body was 200 nm and the narrow pores were separated from each other by the silicon oxide region and hence independent.

Thus, a silicon oxide porous body as shown in FIG. 9 was prepared. The silicon content ratio of the silicon oxide region was about 90 atomic % relative to all the atoms thereof except oxygen.

Example 3

In this example, a specimen of silicon oxide porous body having narrow pores with an average intercentral gap 2R separating pores of 8 nm, an average pore diameter 2r of 6 nm and a height L of 10 nm as shown in FIG. 9 was prepared.

As shown in FIG. 7, an aluminum/silicon structural body containing silicon by 37 atomic % relative to the total quantity of aluminum and silicon was formed on a glass substrate to a thickness of about 10 nm by magnetron sputtering. The target was prepared by placing six 15 mm square silicon chips 13 on a cylindrical aluminum target having a diameter of 4 inches (101.6 mm). The sputtering conditions were as follows. An RF power source was used with Ar flow rate: 50 sccm, discharge pressure: 0.7 Pa and supplied power: 1 kW. The substrate was held at room temperature.

While a target prepared by placing six silicon chips on an aluminum target was used in this example, the number of silicon chips is not limited to six. In other words, it is only necessary that the silicon content in the aluminum/silicon structural body is somewhere around 37 atomic % and therefore the number of chips may be changed depending on the sputtering conditions. Furthermore, the target is not limited to one prepared by placing silicon chips on an aluminum target and a target prepared by putting aluminum chips on a silicon target or one prepared by sintering silicon and aluminum may alternatively be used.

When the aluminum/silicon structural body was observed through an FE-SEM (field emission scanning electron microscope), the perspective view of the specimen observed from above and showing the top surface was such that pillar-shaped members having a cylindrical cross section and containing aluminum were two-dimensionally arranged and surrounded by a silicon region as shown in FIG. 5B. The pore diameter $2r$ of the aluminum nanostructure was 6 nm and the average intercentral gap $2R$ of the aluminum nanostructure was about 8 nm, while the height of the aluminum/silicon structural body was 10 nm. The pillar-shaped members containing aluminum were independent from each other.

The aluminum/silicon structural body containing silicon by 37 atomic % relative to the total quantity of aluminum and silicon was immersed in 5 wt % phosphoric acid for 4 hours so as to selectively etch away only the pillar-shaped members containing aluminum and produce narrow pores. A silicon oxide porous body was produced because selective etching of aluminum and oxidation of silicon had proceeded simultaneously in the above process.

After the etching operation using phosphoric acid, the aluminum/silicon structural body (silicon oxide porous body) was observed through an FE-SEM (field emission scanning electron microscope). The perspective view of the specimen observed from above and showing the top surface was such that narrow pores were two-dimensionally arranged and surrounded by a silicon region as shown in FIG. 5C. The average pore diameter of the narrow pores was 5 nm and the average intercentral gap of the narrow pores was about 8 nm. When a cross section of the aluminum/silicon structural body was observed through the FE-SEM, it was found that the height of structural body was 10 nm and the narrow pores were separated from each other by the silicon oxide region and hence independent. No film had been formed between the narrow pores and the substrate and the narrow pores were directly facing the substrate.

Finally, the silicon oxide porous body was immersed in a solution prepared by diluting a BHF (buffered HF) solution (HF:$HN_4F$=1:5) that was held to 25° C. by 100 times by means of pure water to 10 minutes in order to enlarge the pore diameters of the narrow pores of the prepared silicon oxide porous body.

The prepared silicon oxide porous body was observed through an FE-SEM (field emission scanning electron microscope). The plan view of the surface observed from right above the substrate was such that narrow pores were two-dimensionally arranged and surrounded by a silicon oxide region. The pore diameter of the narrow pores was 6 nm and the average intercentral gap of the narrow pores was about 8 nm. When a cross section of the silicon oxide porous body was observed through the FE-SEM, it was found that the height of porous body was 10 nm.

Thus, a silicon oxide porous body as shown in FIG. 9 was prepared. The silicon content ratio of the silicon oxide region was about 90 atomic % relative to all the atoms thereof except oxygen.

As described above by way of examples, according to the present invention, it is possible to form a silicon oxide porous body comprising narrow pores that have an average intercentral gap not greater than 15 nm and an average pore diameter not greater than 10 nm and are separated from each other by silicon oxide by forming an aluminum/silicon structural body containing silicon by not smaller than 20 atomic % and not greater than 70 atomic % relative to the total quantity of aluminum and silicon by means of a film forming method for forming a substance in a non-equilibrium state, selectively etching only the pillar-shaped members containing aluminum of the aluminum/silicon structural body and oxidizing the aluminum/silicon structural body.

It is also possible to control the size of and the gap separating the narrow pores by controlling the silicon content ratio relative to the total quantity of aluminum and silicon. Thus, it is possible to prepare a silicon oxide porous body comprising narrow pores standing perpendicularly or substantially perpendicularly relative to the substrate and arranged over a large area.

Additionally, according to the invention, it is possible to control the size of the narrow pores, or the thickness of the walls separating the narrow pores of the silicon oxide porous body by subjecting the porous body to a pore diameter enlarging process.

Furthermore, in a silicon oxide porous body according to the invention, no insulating film is formed under the narrow pores so that the narrow pores directly face the substrate.

Example 4

In this example, a specimen of germanium oxide porous body having narrow pores with an average intercentral gap $2R$ separating pores of 15 nm, an average pore diameter $2r$ of 11 nm and a height L of 200 nm as shown in FIG. 9 was prepared.

As shown in FIG. 7, an aluminum/germanium structural body containing germanium by 30 atomic % relative to the total quantity of aluminum and germanium was formed on a glass substrate to a thickness of 200 nm by magnetron sputtering. The target was prepared by placing three 15 mm square germanium chips on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing three germanium chips on an aluminum target was used in this example, the number of germanium chips is not limited to three. In other words, it is only necessary that the germanium content in the aluminum/germanium structural body is somewhere around 30 atomic % and therefore the number of chips may be changed depending on the sputtering conditions. Furthermore, the target is not limited to one prepared by placing germanium chips on an aluminum target and a target prepared by putting aluminum chips on a germanium target or one prepared by sintering germanium and aluminum may alternatively be used.

When the aluminum/germanium structural body was observed through an FE-SEM (field emission scanning electron microscope), it was found that pillar-shaped members having a cylindrical cross section and containing aluminum were two-dimensionally arranged and surrounded by a germanium region as shown in FIG. 5B. The pore diameter of the pillar-shaped members containing aluminum was 12 nm and the average intercentral gap of the pillar-shaped members was 15 nm. The height of the aluminum/germanium structural body was 200 nm. The pillar-shaped members containing aluminum were separated from each other by means of a germanium region.

The aluminum/germanium structural body containing germanium by 30 atomic % relative to the total quantity of aluminum and germanium was immersed in 98% concentrated sulfuric acid for 24 hours so as to selectively etch away only the pillar-shaped members containing aluminum and produce narrow pores. As a result, a germanium nanostructure was produced.

After the etching operation using concentrated sulfuric acid, the aluminum/germanium structural body (germanium porous body) was observed through an FE-SEM (field emission scanning electron microscope). The plan view of the surface observed from right above the substrate revealed that narrow pores were two-dimensionally arranged and surrounded by a germanium region. The pore diameter of the narrow pores was 12 nm and the average intercentral gap of the narrow pores was about 15 nm. When a cross section of the aluminum/germanium structural body was observed through the FE-SEM, it was found that the height of structural body was 200 nm and the narrow pores were separated from each other by the germanium region and hence independent.

Finally, the prepared germanium nanostructure (germanium porous body) was heated in an oxygen atmosphere. More specifically, the specimen was heated at 800° C. for 2 hours, while oxygen was being made to flow at a rate of 50 sccm under the atmospheric pressure. As a result, a germanium oxide porous body was produced.

The oxidized germanium nanostructure (germanium porous body) was analyzed by electron energy loss spectroscopy analysis (EELS) to find that oxygen and germanium were mutually bonded in the specimen to prove that that the germanium contained in the specimen was germanium oxide.

The prepared germanium oxide porous body was observed through an FE-SEM (field emission scanning electron microscope). The plan view of the surface observed from right above the substrate revealed that narrow pores were two-dimensionally arranged and surrounded by a germanium oxide region. The pore diameter of the narrow pores was 11 nm and the average intercentral gap of the narrow pores was about 15 nm. When a cross section of the germanium oxide porous body was observed through the FE-SEM, it was found that the height of porous body was 200 nm and the narrow pores were separated from each other by the germanium oxide region and hence independent.

Thus, a germanium oxide porous body as shown in FIG. 9 was prepared.

The germanium content ratio of the germanium oxide region was about 90 atomic % relative to all the atoms thereof except oxygen.

Example 5

In this example, a specimen of germanium oxide porous body having narrow pores with an average intercentral gap 2R separating pores of 15 nm and an average pore diameter 2r of 12 nm as shown in FIG. 9 was prepared.

As shown in FIG. 7, an aluminum/germanium structural body containing germanium by 37 atomic % relative to the total quantity of aluminum and germanium was formed on a glass substrate to a thickness of about 200 nm by magnetron sputtering. The target was prepared by placing four 15 mm square germanium chips 13 on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing four germanium chips on an aluminum target was used in this example, the number of germanium chips is not limited to four. In other words, it is only necessary that the germanium content in the aluminum/germanium structural body is somewhere around 37 atomic % and therefore the number of chips may be changed depending on the sputtering conditions. Furthermore, the target is not limited to one prepared by placing germanium chips on an aluminum target and a target prepared by putting aluminum chips on a germanium target or one prepared by sintering germanium and aluminum may alternatively be used.

When the aluminum/germanium structural body was observed through an FE-SEM (field emission scanning electron microscope), it was found that pillar-shaped members having a cylindrical cross section and containing aluminum were two-dimensionally arranged and surrounded by germanium region as shown in FIG. 6B. The average pore diameter of the pillar-shaped members containing aluminum was about 10 nm and the average intercentral gap of the pillar-shaped members was about 15 nm. When a cross section of the aluminum/germanium structural body was observed through the FE-SEM, it was found that the height of structural body was 200 nm and the pillar-shaped members containing aluminum were independent from each other.

The aluminum/germanium structural body containing germanium by 37 atomic % relative to the total quantity of aluminum and germanium was immersed in 98% concentrated sulfuric acid for 24 hours so as to selectively etch away only the pillar-shaped members containing aluminum and produce narrow pores. As a result, a germanium nanostructure (germanium porous body) having narrow pores was produced.

The prepared germanium nanostructure (germanium porous body) was observed through an FE-SEM (field emission scanning electron microscope). The perspective view of the specimen observed from above and showing the top surface was such that narrow pores were two-dimensionally arranged and surrounded by a germanium region. The average pore diameter of the narrow pores was about 10 nm and the average intercentral gap of the narrow pores was about 15 nm. When a cross section of the germanium nanostructure was observed through the FE-SEM, it was found that the height of nanostructure was 200 nm and the narrow pores were independent from each other.

Then, the germanium nanostructure was immersed in a solution containing sodium hydroxide by 1 mol/l held to 25° C. for 30 minutes to enlarge the pore diameters of the narrow pores.

After the pore diameter enlarging process, the germanium nanostructure was observed through an FE-SEM (field emission scanning electron microscope). The plan view of the surface observed from right above the substrate revealed that narrow pores were two-dimensionally arranged and surrounded by a germanium region as shown in 6E. The average pore diameter of the narrow pores was 13 nm and the average intercentral gap of the narrow pores was 15 nm, while the height of the germanium nanostructure was 200 nm. The narrow pores were separated from each other by the germanium region and hence independent. No film had been formed between the narrow pores and the substrate so that the narrow pores directly faces the substrate. The specimen was observed by X-ray diffractometry but it was not possible to confirm the existence of a peak that indicates the crystallinity of germanium. In other words, the germanium of the specimen was amorphous.

Finally, the prepared germanium nanostructure (germanium porous body) was heated in an oxygen atmosphere. More specifically, the specimen was heated at 800° C. for 2 hours, while oxygen was being made to flow at a rate of 50 sccm under the atmospheric pressure. As a result, a germanium oxide porous body was produced.

The prepared germanium oxide porous body was observed through an FE-SEM (field emission scanning electron microscope). The plan view of the surface observed from right above the substrate revealed that narrow pores were two-dimensionally arranged and surrounded by a germanium oxide region. The average pore diameter of the narrow pores was 12 nm and the average intercentral gap of the narrow pores was 15 nm. When a cross section of the germanium oxide porous body was observed through the FE-SEM, it was found that the height of porous body was 200 nm and the narrow pores were separated from each other by the germanium oxide region and hence independent.

Thus, a germanium oxide porous body as shown in FIG. 9 was prepared.

The germanium content ratio of the germanium oxide region was about 90 atomic % relative to all the atoms thereof except oxygen.

Example 6

In this example, a specimen of germanium oxide porous body having narrow pores with an average intercentral gap 2R separating pores of 15 nm, an average pore diameter 2r of 12 nm and a height L of 10 nm as shown in FIG. 9 was prepared.

As shown in FIG. 7, an aluminum/germanium structural body containing germanium by 37 atomic % relative to the total quantity of aluminum and germanium was formed on a glass substrate to a thickness of about 10 nm by magnetron sputtering. The target was prepared by placing four 15 mm square germanium chips 13 on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing four germanium chips on an aluminum target was used in this example, the number of germanium chips is not limited to four. In other words, it is only necessary that the germanium content in the aluminum/germanium structural body is somewhere around 37 atomic % and therefore the number of chips may be changed depending on the sputtering conditions. Furthermore, the target is not limited to one prepared by placing germanium chips on an aluminum target and a target prepared by putting aluminum chips on a germanium target or one prepared by sintering germanium and aluminum may alternatively be used.

When the aluminum/germanium structural body was observed through an FE-SEM (field emission scanning electron microscope), the perspective view of the specimen observed from above and showing the top surface was such that pillar-shaped members having a cylindrical cross section and containing aluminum were two-dimensionally arranged and surrounded by a germanium region as shown in FIG. 5B. The average pore diameter 2r of the narrow pores was about 10 nm and the average intercentral gap 2R of the narrow pores was about 15 nm, while the height of the aluminum/germanium structural body was 10 nm. The pillar-shaped members containing aluminum were independent from each other.

The aluminum/germanium structural body containing germanium by 37 atomic % relative to the total quantity of aluminum and germanium was immersed in 5 wt % phosphoric acid for 1 hour so as to selectively etch away only the pillar-shaped members containing aluminum and produce narrow pores. A germanium oxide porous body was produced because selective etching of aluminum and oxidation of germanium had proceeded simultaneously in the above process.

After the etching operation using phosphoric acid, the aluminum/germanium structural body (germanium oxide porous body) was observed through an FE-SEM (field emission scanning electron microscope). The perspective view of the specimen observed from above and showing the top surface was such that narrow pores were two-dimensionally arranged and surrounded by a germanium region as shown in FIG. 5C. The average pore diameter of the narrow pores was 9 nm and the average intercentral gap of the narrow pores was about 15 nm. When a cross section of the aluminum/germanium structural body was observed through the FE-SEM, it was found that the height of structural body was 10 nm and the narrow pores were separated from each other by the germanium region and hence independent.

Finally, the germanium oxide porous body was immersed in a solution prepared by diluting a BHF (buffered HF) solution ($HF:HN_4F=1:5$) that was held to 25° C. by 100 times by means of pure water to 5 minutes in order to enlarge the pore diameters of the narrow pores of the prepared germanium oxide porous body.

The prepared germanium oxide porous body was observed through an FE-SEM (field emission scanning electron microscope). The plan view of the surface observed from right above the substrate was such that narrow pores were two-dimensionally arranged and surrounded by a germanium oxide region. The average pore diameter of the narrow pores was 12 nm and the average intercentral gap of the narrow pores was about 15 nm. When a cross section of the germanium oxide porous body was observed through the FE-SEM, it was found that the height of structural body was 10 nm.

Thus, a germanium oxide porous body as shown in FIG. 9 was prepared. The germanium content ratio of the germanium oxide region was about 90 atomic % relative to all the atoms thereof except oxygen.

As described above by way of examples, according to the present invention, it is possible to form a germanium oxide porous body comprising narrow pores that have an average intercentral gap not greater than 30 nm and an average pore diameter not greater than 20 nm and are separated from each other by germanium oxide by forming an aluminum/germanium structural body containing germanium by not smaller than 20 atomic % and not greater than 70 atomic % relative to the total quantity of aluminum and germanium by means of a film forming method for forming a substance in a non-equilibrium state, selectively etching only the pillar-shaped members containing aluminum of the aluminum/germanium structural body and oxidizing the aluminum/germanium structural body.

It is also possible to control the size of and the gap separating the narrow pores by controlling the germanium content ratio relative to the total quantity of aluminum and germanium. Thus, it is possible to prepare a germanium oxide porous body comprising narrow pores standing perpendicularly or substantially perpendicularly relative to the substrate and arranged over a large area.

Additionally, according to the invention, it is possible to control the size of the narrow pores, or the thickness of the walls separating the narrow pores of the germanium oxide porous body by subjecting the porous body to a pore diameter enlarging process.

Furthermore, in a germanium oxide porous body according to the invention, no insulating film is formed under the narrow pores so that the narrow pores directly face the substrate.

Example 7

In this example, a specimen of silicon germanium oxide porous body having narrow pores with an average intercentral gap 2R separating pores of 10 nm, an average pore diameter 2r of 7 nm and a height L of 200 nm as shown in FIG. 9 was prepared.

As shown in FIG. 7, an aluminum/silicon germanium structural body containing silicon and germanium by 38 atomic % relative to the total quantity of aluminum, silicon and germanium was formed on a glass substrate to a thickness of about 200 nm by magnetron sputtering. The target was prepared by placing two 15 mm square silicon chips and two 15 mm square germanium chips on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing two silicon chips and two germanium chips on an aluminum target was used in this example, the number of silicon and germanium chips is not limited to this. In other words, it is only necessary that the silicon germanium content in the aluminum/silicon germanium structural body is somewhere around 38 atomic % and therefore the number of chips may be changed depending on the sputtering conditions. Furthermore, the target is not limited to one prepared by placing silicon and germanium chips on an aluminum target and a target prepared by putting aluminum and germanium chips on a silicon target, one prepared by putting aluminum and silicon chips on a germanium target or one prepared by sintering silicon, germanium and aluminum may alternatively be used.

When the aluminum/silicon germanium structural body was observed through an FE-SEM (field emission scanning electron microscope), it was found that pillar-shaped members having a cylindrical cross section and containing aluminum were two-dimensionally arranged and surrounded by a silicon germanium region as shown in FIG. 5B. The average diameter of the pillar-shaped members containing aluminum was 7 nm and the average intercentral gap of the pillar-shaped members was 10 nm. The height of the aluminum/silicon germanium structural body was 200 nm. The pillar-shaped members containing aluminum were separated from each other by means of a silicon germanium region.

The aluminum/silicon germanium structural body containing silicon and germanium by 38 atomic % relative to the total quantity of aluminum, silicon and germanium was immersed in 98% concentrated sulfuric acid for 24 hours so as to selectively etch away only the pillar-shaped members containing aluminum and produce narrow pores. As a result, a silicon germanium nanostructure (silicon germanium porous body) was produced.

After the etching operation using concentrated sulfuric acid, the aluminum/silicon germanium nanostructure (silicon germanium porous body) was observed through an FE-SEM (field emission scanning electron microscope). The plan view of the surface observed from right above the substrate revealed that narrow pores were two-dimensionally arranged and surrounded by a silicon germanium region. The average pore diameter of the narrow pores was 7 nm and the average intercentral gap of the narrow pores was about 10 nm. When a cross section of the aluminum/silicon germanium structural body was observed through the FE-SEM, it was found that the height of structural body was 200 nm and the narrow pores were separated from each other by the silicon germanium region and hence independent.

Finally, the prepared silicon germanium nanostructure (silicon germanium porous body) was heated in an oxygen atmosphere. More specifically, the specimen was heated at 800° C. for 2 hours, while oxygen was being made to flow at a rate of 50 sccm under the atmospheric pressure. As a result, a silicon germanium oxide porous body was produced.

The oxidized silicon germanium nanostructure (silicon germanium porous body) was analyzed by electron energy loss spectroscopy analysis (EELS) to find that oxygen and silicon or germanium were mutually bonded in the specimen to prove that that the obtained specimen was a silicon germanium oxide composite body.

The prepared silicon germanium oxide porous body was observed through an FE-SEM (field emission scanning electron microscope). The plan view of the surface observed from right above the substrate revealed that narrow pores were two-dimensionally arranged and surrounded by a silicon germanium oxide region. The average pore diameter of the narrow pores was 6 nm and the average intercentral gap of the narrow pores was about 10 nm. When a cross section of the silicon germanium oxide porous body was observed through the FE-SEM, it was found that the height of porous body was 200 nm and the narrow pores were separated from each other by the silicon germanium oxide region and hence independent.

Thus, a silicon germanium oxide porous body as shown in FIG. 9 was prepared.

The silicon germanium content ratio of the silicon germanium oxide region was about 90 atomic % relative to all the atoms thereof except oxygen.

Example 8

In this example, a specimen of silicon germanium oxide porous body having narrow pores with an average intercentral gap 2R separating pores of 8 nm and an average pore diameter 2r of 6 nm as shown in FIG. 9 was prepared.

As shown in FIG. 7, an aluminum/silicon germanium structural body containing silicon and germanium by 33 atomic % relative to the total quantity of aluminum, silicon and germanium was formed on a glass substrate to a thickness of about 200 nm by magnetron sputtering. The target was prepared by placing three 15 mm square silicon chips and a 15 nm square germanium chip on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing three silicon chips and a germanium chip on an aluminum target was used in this example, the number of silicon and germanium chips is not limited to this. In other words, it is only necessary that the silicon and germanium content in the aluminum/silicon germanium structural body is somewhere around 33 atomic % and therefore the number of chips may be changed depending on the sputtering conditions. Furthermore, the target is not limited to one prepared by placing silicon and germanium chips on an aluminum target and a target prepared by putting germanium and aluminum chips on a silicon target, one prepared by putting silicon and aluminum chips on a germanium target or one prepared by sintering powdery silicon, germanium and aluminum may alternatively be used.

When the aluminum/silicon germanium structural body was observed through an FE-SEM (field emission scanning electron microscope) from right above the substrate, it was found that pillar-shaped members having a cylindrical cross section and containing aluminum were two-dimensionally arranged and surrounded by a silicon germanium region. The average diameter of the pillar-shaped members containing aluminum was about 6 nm and the average intercentral gap of the pillar-shaped members was about 8 nm. When a cross section of the aluminum/silicon germanium structural body was observed through the FE-SEM, it was found that the height of structural body was 200 nm and the pillar-shaped members containing aluminum were independent from each other.

The aluminum/silicon germanium structural body containing silicon and germanium by 33 atomic % relative to the total quantity of aluminum, silicon and germanium was immersed in 98% concentrated sulfuric acid for 24 hours so as to selectively etch away only the pillar-shaped members containing aluminum and produce narrow pores. As a result, a silicon germanium nanostructure having narrow pores (silicon germanium porous body) was produced.

The produced silicon germanium nanostructure (silicon germanium porous body) was observed through an FE-SEM (field emission scanning electron microscope). The perspective view of the specimen observed from above and showing the top surface was such that narrow pores were two-dimensionally arranged and surrounded by a silicon germanium region as shown in FIG. 6C. The average pore diameter of the narrow pores was about 6 nm and the average intercentral gap of the narrow pores was about 8 nm. When a cross section of the silicon germanium nanostructure was observed through the FE-SEM, it was found that the height of nanostructure was 200 nm and the narrow pores were independent from each other.

Then, the aluminum/silicon germanium structural body was immersed in a solution containing sodium hydroxide by 1 mol/l held to 25° C. for 30 minutes to enlarge the pore diameters of the narrow pores.

After the pore diameter enlarging process, the silicon germanium nanostructure (silicon germanium porous body) was observed through an FE-SEM (field emission scanning electron microscope). The plan view of the surface observed from right above the substrate revealed that narrow pores were two-dimensionally arranged and surrounded by a silicon germanium region. The pore diameter of the narrow pore observed was 7 nm and the average intercentral gap of the narrow pores was 8 nm, while the height of the silicon germanium nanostructure was 200 nm. The narrow pores were separated from each other by the silicon germanium region and hence independent. No thin film had been formed between the narrow pores and the substrate and hence the narrow pores were directly facing the substrate. The specimen was observed by X-ray diffractometry but it was not possible to confirm the existence of a peak that indicates the crystallinity of silicon or germanium. In other words, the silicon or germanium of the specimen was amorphous.

Finally, the prepared silicon germanium nanostructure (silicon germanium porous body) was heated in an oxygen atmosphere. More specifically, the specimen was heated at 800° C. for 2 hours, while oxygen was being made to flow at a rate of 50 sccm under the atmospheric pressure. As a result, a silicon germanium oxide porous body was produced.

The prepared silicon germanium oxide porous body was observed through an FE-SEM (field emission scanning electron microscope) The plan view of the surface observed from right above the substrate revealed that narrow pores were two-dimensionally arranged and surrounded by a silicon germanium oxide region. The pore diameter of the narrow pore observed was 6 nm and the average intercentral gap of the narrow pores was about 10 nm. When a cross section of the silicon germanium oxide porous body was observed through the FE-SEM, it was found that the height was 200 nm and the narrow pores were separated from each other by the silicon germanium oxide region and hence independent.

Thus, a silicon germanium oxide porous body as shown in FIG. 9 was prepared. The silicon and germanium content ratio of the silicon germanium oxide region was about 90 atomic % relative to all the atoms thereof except oxygen.

Example 9

In this example, a specimen of silicon germanium oxide porous body having narrow pores with an average intercentral gap 2R separating pores of 10 nm, an average pore diameter 2r of 8 nm and a height L of 10 nm as shown in FIG. 9 was prepared.

As shown in FIG. 7, an aluminum/silicon germanium structural body containing silicon and germanium by 38 atomic % relative to the total quantity of aluminum, silicon and germanium was formed on a glass substrate to a thickness of about 10 nm by magnetron sputtering. The target was prepared by placing two 15 mm square silicon chips and two 15 mm square germanium chips on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing two silicon chips and two germanium chips on an aluminum target was used in this example, the number of silicon and germanium chips is not limited to this. In other words, it is only necessary that the silicon germanium content in the aluminum/silicon germanium structural body is somewhere around 38 atomic % and therefore the number of chips may be changed depending on the sputtering conditions. Furthermore, the target is not limited to one prepared by placing silicon and germanium chips on an aluminum target and a target prepared by putting aluminum and germanium chips on a silicon target, one prepared by putting aluminum and silicon chips on a germanium target or one prepared by sintering powdery silicon, germanium and aluminum may alternatively be used.

When the aluminum/silicon germanium structural body was observed through an FE-SEM (field emission scanning electron microscope), the perspective view of the specimen observed from above and showing the top surface was such that pillar-shaped members having a cylindrical cross section and containing aluminum were two-dimensionally arranged and surrounded by a silicon germanium region as shown in FIG. 5B. The pore diameter 2r of the narrow pores was 7 nm and the average intercentral gap 2R of the narrow pores was 10 nm, while the height L of the aluminum/silicon germanium structural body was 10 nm. The pillar-shaped members containing aluminum were independent from each other.

The aluminum/silicon germanium structural body containing silicon and germanium by 38 atomic % relative to the total quantity of aluminum, silicon and germanium was immersed in 5 wt % phosphoric acid for 1 hour so as to selectively etch away only the pillar-shaped members containing aluminum and produce narrow pores. A silicon germanium oxide porous body was produced because selective etching of aluminum and oxidation of silicon and germanium had proceeded simultaneously in the above process.

After the etching operation using phosphoric acid, the aluminum/silicon germanium structural body (silicon germanium oxide porous body) was observed through an FE-SEM (field emission scanning electron microscope). The perspective view of the specimen observed from above and showing the top surface was such that narrow pores were two-dimensionally arranged and surrounded by a silicon germanium region as shown in FIG. 5C. The pore diameter of the narrow pores was 6 nm and the average intercentral gap of the narrow pores was about 10 nm. When a cross section of the aluminum/silicon germanium structural body was observed through the FE-SEM, it was found that the height of structural body was 10 nm and the narrow pores were separated from each other by the silicon germanium region and hence independent.

Finally, the silicon germanium oxide porous body was immersed in a solution prepared by diluting a BHF (buffered HF) solution (HF:$HN_4F$=1:5) that was held to 25° C. by 100 times by means of pure water for 10 minutes in order to enlarge the pore diameters of the narrow pores of the prepared silicon germanium oxide porous body.

The prepared silicon germanium oxide porous body was observed through an FE-SEM (field emission scanning electron microscope). The plan view of the surface observed from right above the substrate was such that narrow pores were two-dimensionally arranged and surrounded by a silicon germanium oxide region. The pore diameter of the narrow pores was 8 nm and the average intercentral gap of the narrow pores was about 10 nm. When a cross section of the silicon germanium oxide porous body was observed through the FE-SEM, it was found that the height of porous body was 10 nm.

Thus, a silicon germanium oxide porous body as shown in FIG. 9 was prepared. The silicon and germanium content ratio of the silicon germanium oxide region was about 90 atomic % relative to all the atoms thereof except oxygen.

As described above by way of examples, according to the present invention, it is possible to form a silicon germanium oxide porous body comprising narrow pores that have an average intercentral gap not greater than 30 nm and an average pore diameter not greater than 20 nm and are separated from each other by silicon germanium oxide by forming an aluminum/silicon germanium structural body containing silicon germanium by not smaller than 20 atomic % and not greater than 70 atomic % relative to the total quantity of aluminum, silicon and germanium by means of a film forming method for forming a substance in a non-equilibrium state, selectively etching only the pillar-shaped members containing aluminum of the aluminum/silicon germanium structural body and oxidizing the aluminum/silicon germanium structural body.

It is also possible to control the size of and the gap separating the narrow pores by controlling the silicon and germanium content ratio relative to the total quantity of aluminum, silicon and germanium. Thus, it is possible to prepare a silicon germanium oxide porous body comprising narrow pores standing perpendicularly or substantially perpendicularly relative to the substrate and arranged over a large area.

Additionally, according to the invention, it is possible to control the size of the narrow pores, or the thickness of the walls separating the narrow pores of the silicon germanium oxide porous body by subjecting the porous body to a pore diameter enlarging process.

Furthermore, in a silicon germanium oxide porous body according to the invention, no insulating film is formed under the narrow pores so that the narrow pores directly face the substrate.

The present invention makes it possible to apply narrow pores in silicon oxide, germanium oxide and silicon germanium oxide in various different modes so that the scope of application of such pores is greatly broadened. For example, a silicon oxide porous body, a germanium oxide porous body and a silicon germanium oxide porous body according to the invention can find applications in the field of functional materials that can be used for self emission type devices, optical devices and microdevices. Furthermore, such porous bodies can be used for base structures and molds for forming novel nanostructures. Additionally they may be used for filters and masks to be used for etching operations.

Example 10

In this example, a specimen of silicon oxide nanostructure having narrow pores with an average intercentral gap 2R separating pores of 8 nm, an average pore diameter of 5 nm and a height L of 200 nm as shown in FIG. 9 was prepared.

As shown in FIG. 7, an aluminum/silicon composite film containing silicon by 37 atomic % relative to the total quantity of aluminum and silicon was formed on a glass substrate to a thickness of about 200 nm by magnetron sputtering. The target was prepared by placing six 15 mm square silicon chips on a cylindrical aluminum target having a diameter of 4 inches (101.6 mm). The sputtering conditions were as follows. An RF power source was used with Ar flow rate: 50 sccm, discharge pressure: 0.7 Pa and supplied power: 300 W. The substrate was held at room temperature (25° C.).

While a target prepared by placing six silicon chips on an aluminum target was used in this example, the number of silicon chips is not limited to six. In other words, it is only necessary that the silicon content in the aluminum/silicon composite film is somewhere around 37 atomic % and therefore the number of chips may be changed depending on the sputtering conditions. Furthermore, the target is not limited to one prepared by placing silicon chips on an aluminum target and a target prepared by putting aluminum chips on a silicon target or one prepared by sintering silicon and aluminum may alternatively be used.

When the aluminum/silicon composite film was observed through an FE-SEM (field emission scanning electron microscope), it was found that pillar-shaped-aluminum structures having a cylindrical cross section were two-dimensionally arranged and surrounded by a silicon region as shown in FIG. 5B. The average diameter of the pillar-shaped aluminum structures was 6 nm and the average intercentral gap of the pillar-shaped aluminum structures was 8 nm. The height of the aluminum/silicon composite film was 200 nm. The pillar-shaped aluminum structures were separated from each other by means of a silicon region.

The aluminum/silicon composite film containing silicon by 37 atomic % relative to the total quantity of aluminum and silicon was subjected to an anodic oxidation process in an anodic oxidation system to produce narrow pores in it. An aqueous sulfuric acid solution whose acid concentration was regulated to 7 mol/l was used as electrolytic solution and the solution was held to 20° C. in a thermostat-controlled tank. An anodic oxidation voltage of 5V was applied. As a result, a silicon oxide nanostructure was prepared.

After the anodic oxidation process, the aluminum/silicon composite film (silicon oxide nanostructure) was observed through an FE-SEM (field emission scanning electron microscope). The perspective view of the specimen observed from above and showing the top surface was such that narrow pores 32 were two-dimensionally arranged and surrounded by a silicon oxide region 33 as shown in FIG. 9. The average pore diameter of the narrow pores was about 5 nm and the average intercentral gap of the narrow pores was about 8 nm. When a cross section of the aluminum/silicon composite film was observed through the FE-SEM, it was found that the height of composite film was 200 nm and the narrow pores were separated from each other by the silicon oxide region and hence independent. No film had been formed between the narrow pores and the substrate and the bottoms of the narrow pores were directly facing the substrate.

The oxidized specimen of the silicon oxide nanostructure was analyzed by electron energy loss spectroscopy analysis (EELS) to find that oxygen and silicon were mutually bonded in the specimen to prove that that the silicon contained in the specimen was silicon oxide.

The content ratio of aluminum and that of silicon in the specimen obtained by oxidizing the silicon oxide nanostructure was measured by means of inductively coupled plasma atomic emission spectroscopy (ICP) to find that they are respectively 5 atomic % and 95 atomic % relative to the total quantity of aluminum and silicon.

Thus, it was confirmed that a silicon oxide nanostructure as shown in FIG. 9 had been prepared.

Example 11

In this example, a specimen of silicon oxide nanostructure having narrow pores with an average intercentral gap $2R$ separating pores of 7 nm and an average pore diameter $2r$ of 5 nm as shown in FIG. 9 was prepared.

As shown in FIG. 7, an aluminum/silicon composite film containing silicon by 45 atomic % relative to the total quantity of aluminum and silicon was formed on a quartz substrate to a thickness of about 200 nm by magnetron sputtering. The target was prepared by placing eight 15 mm square silicon chips on a cylindrical aluminum target having a diameter of 4 inches (101.6 mm). The sputtering conditions were as follows. An RF power source was used with Ar flow rate: 50 sccm, discharge pressure: 0.7 Pa and supplied power: 1 kW. The substrate was held at room temperature.

While a target prepared by placing eight silicon chips on an aluminum target was used in this example, the number of silicon chips is not limited to eight. In other words, it is only necessary that the silicon content in the aluminum/silicon composite film is somewhere around 45 atomic % and therefore the number of chips may be changed depending on the sputtering conditions. Furthermore, the target is not limited to one prepared by placing silicon chips on an aluminum target and a target prepared by putting aluminum chips on a silicon target or one prepared by sintering silicon and aluminum may alternatively be used.

When the aluminum/silicon composite film was observed through an FE-SEM (field emission scanning electron microscope) from right above the substrate, it was found that pillar-shaped aluminum structures having a cylindrical cross section were two-dimensionally arranged and surrounded by a silicon region as shown in FIG. 5B. The average diameter of the pillar-shaped aluminum structures was about 3 nm and the average intercentral gap of the pillar-shaped aluminum structures was 7 nm. When a cross section of the aluminum/silicon composite film was observed through the FE-SEM, it was found that the height of composite film was 200 nm and the pillar-shaped aluminum structures were independent from each other.

The aluminum/silicon composite film containing silicon by 45 atomic % relative to the total quantity of aluminum and silicon was subjected to an anodic oxidation process in an anodic oxidation system to produce narrow pores 32 in it. An aqueous sulfuric acid solution whose acid concentration was regulated to 7 mol/l was used as electrolytic solution and the solution was held to 10° C. in a thermostat-controlled tank. An anodic oxidation voltage of 5V was applied. As a result, a silicon oxide nanostructure was prepared.

The prepared silicon oxide nanostructure was observed through an FE-SEM (field emission scanning electron microscope). The perspective view of the specimen observed from above and showing the top surface was such that narrow pores were two-dimensionally arranged and surrounded by a silicon oxide region as shown in FIG. 5C. The average pore diameter of the narrow pores was about 2 nm and the average intercentral gap of the narrow pores was about 7 nm. When a cross section of the silicon oxide nanostructure was observed through the FE-SEM, it was found that the height of nanostructure was 200 nm and the narrow pores were independent from each other.

Then, the silicon oxide nanostructure was immersed in a solution containing sodium hydroxide by 1 mol/l held to 65° C. for 2 minutes to enlarge the pore diameters of the narrow pores.

After the pore diameter enlarging process, the silicon oxide nanostructure was observed through an FE-SEM (field emission scanning electron microscope). The perspective view of the surface observed from above the substrate and showing the top surface revealed that narrow pores 32 were two-dimensionally arranged and surrounded by a silicon oxide region 33 as shown in FIG. 9. The pore diameter of the narrow pores observed was 5 nm and the average intercentral gap of the narrow pores was 7 nm, while the height of the silicon oxide nanostructure was 200 nm. The narrow pores were separated from each other by the silicon oxide region and hence independent. No film had been formed between the narrow pores and the substrate and the narrow pores were directly facing the substrate.

Thus, a silicon oxide nanostructure as shown in FIG. 9 was prepared.

Example 12

In this example, a specimen of silicon oxide nanostructure having narrow pores with an average intercentral gap $2R$ separating pores of 8 nm, an average pore diameter $2r$ of 6 nm and a height L of 10 nm as shown in FIG. 9 was prepared.

As shown in FIG. 7, an aluminum/silicon composite film containing silicon by 37 atomic % relative to the total quantity of aluminum and silicon was formed on a silicon substrate to a thickness of 10 nm by magnetron sputtering. A sintered aluminum/silicon mixture target prepared by mixing powdery silicon and aluminum to a mixing ratio of 63 atomic %:37 atomic % and sintering the mixture was used in this example. The sputtering conditions were as follows. An RF power source was used with Ar flow rate: 50 sccm, discharge pressure: 0.7 Pa and supplied power: 300 W. The substrate was held at room temperature (25° C.).

When the aluminum/silicon composite film was observed through an FE-SEM (field emission scanning electron microscope), the perspective view of the specimen observed from above and showing the top surface was such that pillar-shaped aluminum structures having a cylindrical cross section were two-dimensionally arranged and surrounded by a silicon region as shown in FIG. 5B. The average pore diameter 2r of the pillar-shaped aluminum structures was 6 nm, the average intercentral gap 2R of the pillar-shaped structures was 8 nm, while the height L of the aluminum/silicon composite film was 10 nm. The pillar-shaped aluminum structures were independent from each other.

The aluminum/silicon composite film containing silicon by 37 atomic % relative to the total quantity of aluminum and silicon was subjected to an anodic oxidation process in an anodic oxidation system as shown in FIG. 8 to produce narrow pores in it. An aqueous sulfuric acid solution whose acid concentration was regulated to 7 mol/l was used as electrolytic solution and the solution was held to 20° C. in a thermostat-controlled tank. An anodic oxidation voltage of 3V was applied. As a result, a silicon oxide nanostructure was prepared.

After the anodic oxidation process, the aluminum/silicon composite film (silicon oxide nanostructure) was observed through an FE-SEM (field emission scanning electron microscope). The perspective view of the specimen observed from above the substrate and showing the top surface was such that narrow pores were two-dimensionally arranged and surrounded by a silicon oxide region. The pore diameter of the narrow pores was 5 nm and the average intercentral gap of the narrow pores was about 8 nm. When a cross section of the aluminum/silicon composite film was observed through the FE-SEM, it was found that the height of composite film was 10 nm and the narrow pores were separated from each other by the silicon oxide region and hence independent. No film had been formed between the narrow pores and the substrate and hence the narrow pores were directly facing the substrate.

Finally, the silicon oxide nanostructure was immersed in a solution prepared by diluting a BHF (buffered HF) solution (HF:HN$_4$F=1:5) that was held to 25° C. by 100 times by means of pure water for 10 minutes in order to enlarge the pore diameters of the narrow pores of the prepared silicon oxide nanostructure.

The prepared silicon oxide nanostructure was observed through an FE-SEM (field emission scanning electron microscope). The plan view of the surface observed from right above the substrate was such that narrow pores 32 were two-dimensionally arranged and surrounded by a silicon oxide region 33 as shown in FIG. 9. The average pore diameter of the narrow pores was 6 nm and the average intercentral gap of the narrow pores was about 8 nm. When a cross section of the silicon oxide nanostructure was observed through the FE-SEM, it was found that the height of nanostructure was 10 nm. Thus, a silicon oxide nanostructure as shown in FIG. 9 was prepared.

As described above by way of examples, according to the present invention, it is possible to form a silicon oxide nanostructure comprising narrow pores that have an average intercentral gap not greater than 15 nm and an average pore diameter not greater than 10 nm and are separated from each other by silicon oxide region by forming an aluminum/silicon composite film containing silicon by not smaller than 20 atomic % and not greater than 70 atomic % relative to the total quantity of aluminum and silicon by means of a film forming method for forming a substance in a non-equilibrium state and subjecting the composite film to anodic oxidation at low cost in a simple manner if compared with conventional semiconductor processing techniques.

Additionally, since the process of forming a silicon oxide nanostructure can be conducted at room temperature, it is now possible to use organic substrates or the like that are not resistive against high temperature so that the scope of application of silicon oxide nanostructures can be remarkably broadened.

INDUSTRIAL APPLICABILITY

This invention makes it possible to apply narrow pores in silicon oxide materials in various different ways so that the scope of application of such pores is greatly broadened. For example, a silicon oxide porous body according to the invention can find applications in the field of functional materials that can be used for self emission type devices, optical devices and microdevices. Furthermore, such porous bodies can be used for base structures and molds for forming novel nanostructures. Additionally they may be used for filters.

What is claimed is:

1. A method of manufacturing a porous body comprising the steps of:
    preparing a structural body formed solely by sputtering so as to contain a first material containing aluminum and a second material containing Si, Ge, SiGe, or any combination thereof, and including pillar-shaped members formed so as to contain the first material and surrounded by a region formed so as to contain the second material;
    removing the pillar-shaped members from the structural body; and
    oxidizing the region.

2. The method according to claim 1, wherein the structural body contains the second material at a ratio of not smaller than 20 atomic % and not greater than 70 atomic % relative to a total quantity of the first and second materials.

3. The method according to claim 1, wherein the structural body is prepared by using a process of forming a film in a non-equilibrium state.

4. The method according to claim 1, wherein the removing step is wet etching using an acid or an alkali.

5. The method according to claim 1, further comprising a step of enlarging pore diameters of narrow pores formed in the removing step.

6. The method according to claim 1, wherein diameters of the pillar-shaped members are not greater than 20 nm and an average intercentral distance of a plurality of pillar-shaped pores is not greater than 30 nm.

7. The method according to claim 1, wherein the region is subjected to an oxidation process after formation of the porous body by the removing step.

8. The method according to claim 1, wherein the region is subjected to an oxidation process simultaneously with the removing step.

9. A method of manufacturing a porous body comprising the steps of:
    preparing a structural body formed solely by sputtering so as to contain aluminum and silicon and including pillar-shaped members formed so as to contain aluminum and a silicon region surrounding the pillar-shaped members, the structural body containing silicon at a ratio of not smaller than 20 atomic % and not greater than 70 atomic % relative to a total quantity of the aluminum and the silicon;
    forming a porous body by removing the pillar-shaped members from the structural body; and
    oxidizing the porous body.

10. The method according to claim 9, wherein the silicon region contains germanium.

* * * * *